United States Patent
Higo et al.

(10) Patent No.: US 8,472,243 B2
(45) Date of Patent: Jun. 25, 2013

(54) STORAGE APPARATUS

(75) Inventors: Yutaka Higo, Kanagawa (JP); Hiroyuki Uchida, Kanagawa (JP); Hiroyuki Ohmori, Kanagawa (JP); Kazuhiro Bessho, Kanagawa (JP); Masanori Hosomi, Tokyo (JP); Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 100 days.

(21) Appl. No.: 13/155,099

(22) Filed: Jun. 7, 2011

(65) Prior Publication Data
US 2012/0002466 A1  Jan. 5, 2012

(30) Foreign Application Priority Data
Jun. 30, 2010 (JP) ................................. 2010-150178

(51) Int. Cl.
*G11C 11/14* (2006.01)
(52) U.S. Cl.
USPC ............................ 365/171; 365/158; 365/173
(58) Field of Classification Search
USPC .................................. 365/171, 173, 148, 158
See application file for complete search history.

(56) References Cited

U.S. PATENT DOCUMENTS

| 5,695,864 A | 12/1997 | Slonczewski | |
|---|---|---|---|
| 2008/0180992 A1* | 7/2008 | Yamane et al. | 365/171 |
| 2008/0247072 A1* | 10/2008 | Nozieres et al. | 360/59 |

FOREIGN PATENT DOCUMENTS
JP  2003-017782  1/2003

* cited by examiner

*Primary Examiner* — Alexander Sofocleous
*Assistant Examiner* — Hien Nguyen
(74) *Attorney, Agent, or Firm* — Dentons US LLP

(57) ABSTRACT

Disclosed herein is a storage apparatus including a cell array configured to include storage devices arranged to form an array. Each of the storage device has: a storage layer for storing information as the state of magnetization of a magnetic substance; a fixed-magnetization layer having a fixed magnetization direction; and a tunnel insulation layer sandwiched between the storage layer and the fixed-magnetization layer. In an operation to write information on the storage layer, a write current is generated to flow in the layer-stacking direction of the storage layer and the fixed-magnetization layer in order to change the direction of the magnetization of the storage layer. The cell array is divided into a plurality of cell blocks. The thermal stability of the storage layer of any particular one of the storage devices has a value peculiar to the cell block including the particular storage device.

7 Claims, 12 Drawing Sheets

STORAGE APPARATUS

BACKGROUND

The present disclosure relates to a storage apparatus (or a memory) used for recording data in each of storage devices composing the storage apparatus in accordance with a spin-torque magnetization inverting method.

With rapid development of various kinds of information equipment ranging from a mobile terminal to a high-performance server, devices composing a memory and a logic circuit which are employed in such equipment are also requisite to display high performance typically by being highly integrated and being capable of operating at a high speed and a low power consumption.

In particular, the progress of a semiconductor nonvolatile memory is remarkable. For example, the popularization of a flash memory serving as a large-capacity file memory is advancing at a pace driving out the hard-disk drive.

In the mean time, aimed at code storage applications and further development toward a working memory, the development of a semiconductor nonvolatile memory supposed to replace memories generally used nowadays is making progress. Typical examples of the memories generally used nowadays are the NOR flash memory and the DRAM whereas typical examples of the semiconductor nonvolatile memory supposed to replace the memories generally used nowadays are a FeRAM (Ferroelectric Random Access Memory), a MRAM (Magnetic Random Access Memory) and a PCRAM (Phase Change Random Access Memory). Some of the semiconductor nonvolatile memories supposed to replace the memories generally used nowadays have been put to practical use.

The MRAM which is a typical semiconductor nonvolatile memory stores data as a direction of magnetization of a magnetic substance composing the MRAM. Thus, stored data can be updated at a high speed. In addition, data stored at a storage location can be updated an infinite number of times. To put it concretely, data stored at a storage location can be updated at $10^{15}$ or more times. The MRAM is already used in fields including industrial automation and avionic equipment.

Since the MRAM operates at a high speed and with a high degree of reliability, the development of the MRAM toward a code storage memory and/or a working memory is expected in the future.

However, the MRAM raises problems when efforts are made to lower the power consumption of the MRAM and increase its storage capacity.

These problems are intrinsic problems caused by the recording principle of the MRAM. In accordance with a recording method based on the recording principle of the MRAM, magnetization is inverted by a field generated by a current flowing through a wire.

As one method for solving the problems described above, recording methods (that is, magnetization inverting methods) not relying on such a current-generated field are studied. The recording methods include a spin-torque magnetization inverting method which is a subject of extensive and intensive research. For more information on the spin-torque magnetization inverting method, the reader is advised to refer to documents such as U.S. Pat. No. 5,695,864 and Japanese Patent Laid-Open No. 2003-17782.

Much like the MRAM, a storage device operating in accordance with the spin-torque magnetization inverting method is constructed from an MTJ (Magnetic Tunnel Junction).

The MTJ of the storage device includes a fixed-magnetization layer and a storage layer. The fixed-magnetization layer is a layer magnetized in a certain fixed direction whereas the storage layer is a layer magnetized not in a fixed direction. A tunnel junction is created by providing a tunnel insulation layer between the fixed-magnetization layer and the storage layer.

Data of 0 or 1 is read out from the MTJ by the so-called tunnel magnetic resistance effect in which the resistance of the MTJ changes in accordance with an angle formed by the fixed direction of the magnetization of the fixed-magnetization layer and the direction of the magnetization of the storage layer.

In a write operation, on the other hand, when spin polarized ions passing through the fixed-magnetization layer enter the storage layer, the electrons apply torques to the magnetic layer and, if a current having a magnitude at least equal to a threshold value determined in advance flows due to the torques, the direction of the magnetization of the storage layer is inverted.

Data of 0 or 1 to be written into a storage device in a write operation is selected by changing the polarity of the current flowing to the storage device.

In the case of a storage device of a scale of about 0.1 μm, the absolute value of a current for inverting the direction of the magnetization of the storage layer of the storage device is not greater than 1 mA.

In addition, this value of the current decreases proportionally to the volume of the storage device, making scaling possible.

On top of that, it is not necessary to provide a word line for producing a current-generated magnetic field required by the MRAM to serve as a field for recording data. Thus, this storage device offers a merit of a simple cell structure.

In the following description, an MRAM adopting the spin-torque inversion method is referred to as an ST-MRAM (Spin Torque-Magnetic Random Access Memory).

As a nonvolatile memory allowing the power consumption thereof to be decreased and the storage capacity thereof to be increased while sustaining the merits offered by the MRAM as they are, the ST-MRAM is much expected. It is to be noted that the merits offered by the MRAM are the high operation speed and the infinite number of allowable updating operations.

SUMMARY

By the way, in an operation to write data into a storage device of the ST-MRAM, a write voltage needs to be applied in the layer-stacking direction of the storage device. Normally, the write voltage has a magnitude in a range of about 0.5 V to 1.5 V.

In comparison with the electrostatic breakdown voltage of the tunnel insulation layer, however, the magnitude of the write voltage is not an ignorable magnitude.

That is to say, when a write operation is carried out repeatedly, the tunnel insulation layer experiences electric-field stress for a long time and, when the tunnel insulation layer experiences electric-field stress for a long time, the tunnel insulation layer may electro-statically break down in some cases. The larger the magnitude of the write voltage, the higher the probability that the tunnel insulation layer electro-statically tends to break down.

If the memory device electro-statically breaks down, the resistance of the memory device itself decreases substantially and a tunnel magnetic resistance effect no longer occurs so that information cannot be read out as a change in resistance. In addition, it is impossible to write new information into a storage device that has electro-statically broken down.

On top of that, the characteristic of holding information stored in the ST-MRAM is dependent on the thermal stability of the storage layer. That is to say, if the storage layer has good thermal stability, information stored in the ST-MRAM can be held for a long time proportional to the quality of the thermal stability.

In accordance with the theory of spin-torque magnetization inversion, however, the thermal stability is proportional to the write voltage. Thus, in order to improve the characteristic of holding information stored in the ST-MRAM, it is necessary to raise the write voltage at the same time. However, a high write voltage contributes to electrostatic damage of the tunnel insulation layer.

As described above, the electrostatic damage of the memory device imposes a limit on the number of write operations that can be carried out on the ST-MRAM. That is to say, the electrostatic damage of the memory device causes the ST-MRAM to no longer have the infinite number of write operations that can be carried out on the ST-MRAM as one of merits of the MRAM.

It is thus desirable to present a storage apparatus capable of increasing the number of write operations that can be carried out on the storage apparatus by adoption of a write method not destructing the storage device of the storage apparatus.

The storage apparatus provided by the present disclosure employs a cell array configured to include storage devices arranged to form an array.

The storage device has a storage layer for storing information as the state of magnetization of a magnetic substance composing the storage layer and a fixed-magnetization layer separated away from the storage layer by a tunnel insulation layer to serve as a fixed-magnetization layer having a fixed magnetization direction. In an operation to write information on the storage layer, the storage device drives a write current to flow in the layer-stacking direction of the storage layer and the fixed-magnetization layer in order to change the direction of the magnetization of the storage layer.

In addition, the cell array is divided into a plurality of cell blocks and the thermal stability of the storage layer of the storage device has a value which varies from cell block to cell block.

As described above, in the configuration of the storage apparatus provided by the present disclosure, the cell array is divided into a plurality of cell blocks and the thermal stability of the storage layer of the storage device has a value which varies from cell block to cell block.

Thus, in a cell block with a small storage-layer thermal stability, the write current can be reduced and, by reducing the write current, the number of write operations that can be carried out on a storage device can be increased. In addition, in a cell block with a large storage-layer thermal stability, the length of time to hold information stored in a storage device can be increased.

In accordance with the present disclosure, in a cell block with a small storage-layer thermal stability, the number of write operations that can be carried out on a storage device can be increased.

In addition, in a cell block with a large storage-layer thermal stability, the length of time to hold information stored in a storage device can be increased.

Thus, in accordance with the present disclosure, it is possible to implement a storage apparatus capable of increasing the number of write operations that can be carried out on storage devices and the length of time to hold information stored in storage devices.

DETAILED DESCRIPTION OF THE PREFERRED EMBODIMENT

Figure 1:
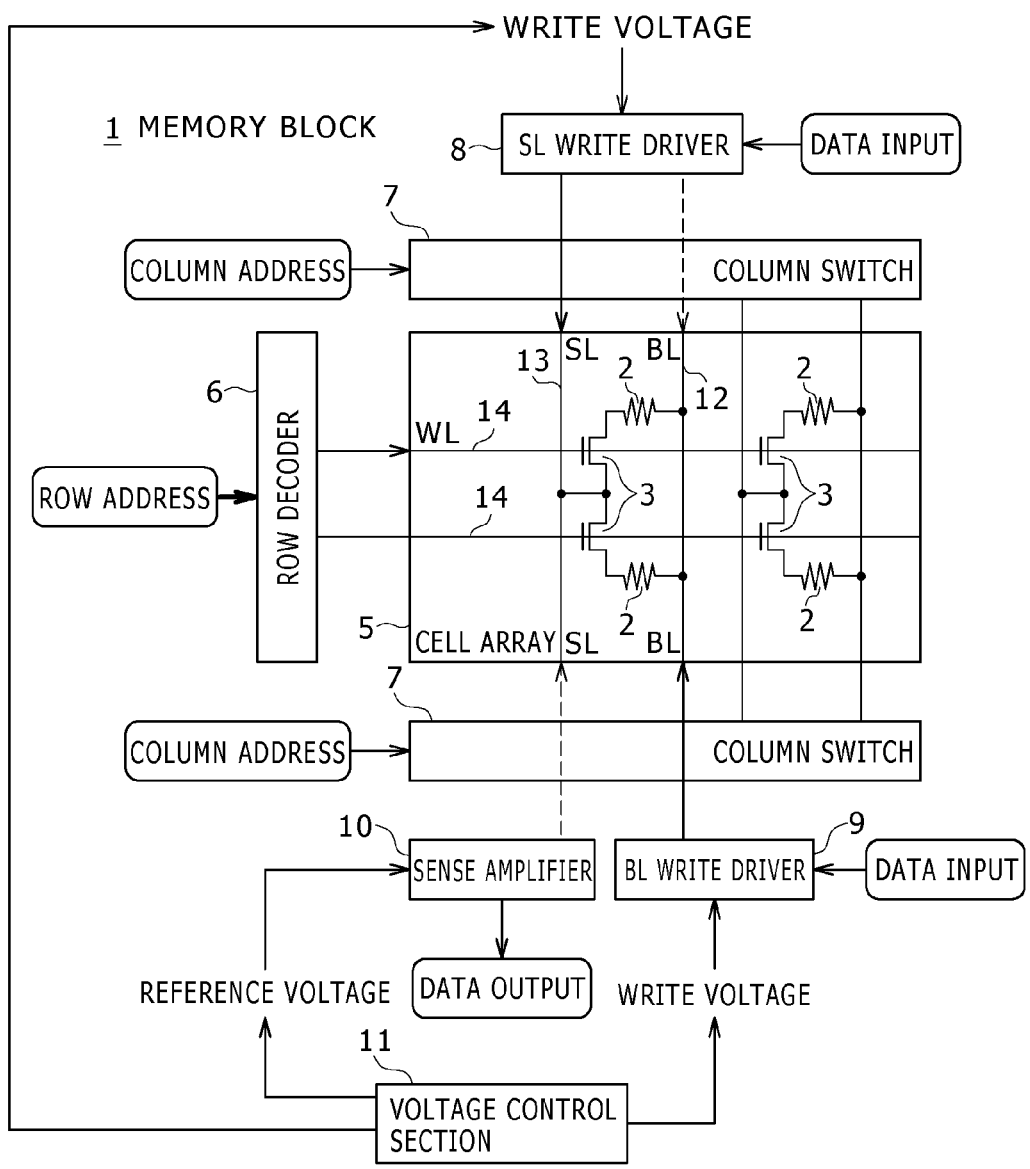
FIG. 1 is a functional block diagram showing a typical internal configuration of the existing ST-MRAM.

A preferred implementation of the present disclosure is explained below by referring to diagrams. In the following description, the preferred implementation of the present disclosure is referred to as an embodiment.

It is to be noted that the embodiment is explained in chapters arranged in the following order.
1: Basic Configuration of Storage Apparatus According to the Embodiment of the Disclosure
2: Principle of Operations Carried Out by the Storage Apparatus
3: Embodiment Implementing the Storage Apparatus According to the Embodiment of the Disclosure
4: Error Rates of the Storage Apparatus
5: ECC (Error Correction Codes)
6: Typical Computations
7: Method for Changing the Thermal Stability Indicator Δ
8: Method for Creating Cell Blocks Having Different Thermal Stability Indicators Δ
1: Basic Configuration of Storage Apparatus According to the Embodiment of the Disclosure A storage apparatus according to an embodiment of the disclosure is designed to increase the number of write operations that can be carried out on the storage apparatus as is the case with an ST-RAM.

Results of a variety of studies carried out by people including inventors of the present disclosure indicate that, by dividing a cell array employed in a storage apparatus into a plurality of cell blocks and by providing the storage layer of every storage device employed in the storage apparatus with a thermal stability indicator Δ varying from cell block to cell block, it is possible to raise the number of write operations that can be carried out on the storage apparatus.

The storage apparatus provided by the embodiment of the present disclosure employs a cell array configured to include storage devices arranged to form an array.

The storage device has a storage layer for storing information as the state of magnetization of a magnetic substance and a fixed-magnetization layer separated away from the storage layer by a tunnel insulation layer to serve as a fixed-magnetization layer having a fixed magnetization direction.

In an operation to write information on the storage layer, the storage device drives a write current to flow in the layer-stacking direction of the storage layer and the fixed-magnetization layer in order to change the direction of the magnetization of the storage layer.

As described above, the cell array of the storage apparatus is configured to include storage devices arranged to form an array. In addition, the cell array is divided into a plurality of cell blocks.

On top of that, the thermal stability of the storage layer of a storage device has a value peculiar to a cell block including the storage device. That is to say, the thermal stability of the storage layer of a storage device included in a particular cell block has a value different from a value assigned to the thermal stability of the storage layer of a storage device included in a cell block other than the particular cell block.

In addition, every cell block is provided with a peripheral circuit required for driving memory operations so that each cell block is capable of operating as an independent memory.

In a typical concrete configuration of the storage apparatus according to the embodiment of the present disclosure, for example, the cell array of the storage apparatus is divided into two cell blocks. The cell block with a large thermal-stability value is used as a main memory whereas the cell block with a small thermal-stability value is used as a cache memory provided for the main memory.

By adoption of a commonly known cache technology, a number of read/write operations are carried out on the cache memory instead of being carried out directly on the main memory.

Since the cell block with a small thermal-stability value is used as a cache memory, the write voltage applied to the cache memory can be reduced so that the number of write operations can be raised.

In addition, in accordance with a proposal based on the commonly known cache technology, only when a free area no longer exists in the cache memory, is information transferred from the cache memory to the main memory in a write-back operation in order to create a free area in the cache memory. In this way, the number of write operations carried out on the main memory can be reduced.

On top of that, it is possible to sustain information, which has been stored in the main memory, for a long time. This is because the cell block with a large thermal-stability value is used as the main memory, that is, because the thermal stability of the storage layer of each storage device included in the main memory has a large value.

2: Principle of Operations Carried Out by the Storage Apparatus

Next, before explaining an embodiment of the present disclosure, the following description explains the principle of operations carried out by the storage apparatus according to the embodiment of the present disclosure by referring to FIG. 1.

FIG. 1 is a functional block diagram showing a typical internal configuration of the existing ST-MRAM corresponding to the storage apparatus according to the embodiment of the present disclosure.

A memory block 1 shown in FIG. 1 is configured to employ a cell array 5 including memory cells. The memory block 1 also employs circuit components which are used for supplying voltages and the like to the memory cells in order to drive the memory cells.

The cell array 5 is configured to include memory cells each having a storage device 2 and a select MOS transistor 3.

Each of the storage devices 2 composing the cell array 5 is connected to a SL (source line) 13 by a select MOS transistor 3 and connected to a BL (bit line) 12. Forming a pair, the bit line 12 and the source line 13 are stretched over the cell array 5 in the vertical direction. Each of the storage devices 2 is used for storing 1-bit information of 0 or 1.

On the other hand, the gate electrode of the select MOS transistor 3 is connected to a WL (word line) 14 stretched in the horizontal direction.

Incidentally, the cell array 5 shown in FIG. 1 is configured to have four rows and four columns. In actuality, however, a cell array has a large number of rows and a large number of columns. Thus, a large cell array can be constructed.

For example, a cell array can be configured to have 512 rows and 512 columns. In the case of such a cell array, the number of aforementioned bit lines 12, the number of aforementioned source lines 13 and the number of word lines 14 are each 512.

The left end of every word line 14 is connected to a row decoder 6 provided on the left-hand side of the cell array 5. The right end of every word line 14 is connected to nothing.

The upper end of every bit line 12 and source line 13 is connected to a column switch 7 provided on the upper side of the cell array 5 whereas the lower end of every bit line 12 and source line 13 is connected to a column switch 7 provided on the lower side of the cell array 5.

If the cell array 5 is configured to have 512 rows and 512 columns, the address of every memory cell in the cell array 5 is expressed by 18 bits. The 9 high-order bits of the 18 bits is the address of a row on which the memory cell is provided. On the other hand, the 9 low-order bits of the 18 bits is the address of a column on which the memory cell is provided. In the following description, the address of a row on which a memory cell is provided is referred to as the row address of the memory cell. On the other hand, the address of a column on which a memory cell is provided is referred to as the column address of the memory cell. The row address is supplied to the row decoder 6 whereas the column address is supplied to the column switches 7 provided on the upper and lower sides of the cell array 5.

In addition, the memory block 1 is also provided with an SL write driver 8 for asserting a write voltage on the source line 13. The memory block 1 is also provided with a BL write driver 9 for asserting a write voltage on the bit line 12. The SL write driver 8 and the BL write driver 9 together function as a write section for writing information on a storage device 2.

On top of that, the memory block 1 is also provided with a sense amplifier 10 to be connected to the source line 13 to serve as an amplifier for detecting a sensed voltage representing a read current flowing from a storage device 2 used for storing 1-bit information. The sense amplifier 10 also receives a reference voltage having a magnitude determined in advance from a voltage control section 11. The sense amplifier 10 compares the sensed voltage with the reference voltage in order to read out the 1-bit information from the storage device 2.

In the memory block 1 according to this embodiment, the sense amplifier 10 functions as a read section for reading out information from a storage device 2.

The voltage control section 11 controls the write voltages for writing information onto the cell array 5 also referred to as a storage block and the reference voltage supplied to the sense amplifier 10.

Configuration of the Storage Device

Next, the following description explains the configuration of the storage device 2 employed in every memory cell of the cell array 5 shown in FIG. 1.

Figure 2:
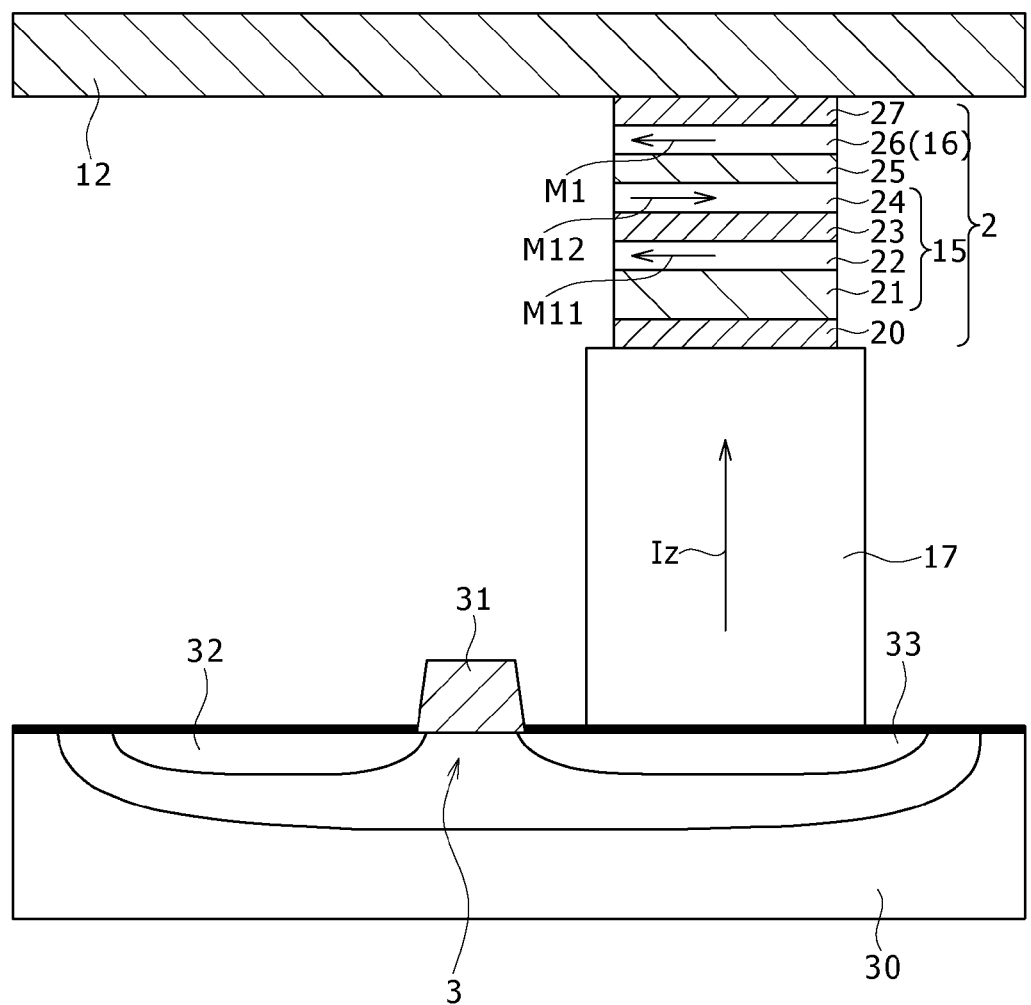
FIG. 2 is a cross-sectional diagram showing a model of a storage device and a select MOS transistor which are employed in a memory cell of the ST-MRAM.

FIG. 2 is a cross-sectional diagram showing a model of the storage device 2 and the select MOS transistor 3 which are employed in a memory cell of the cell array 5 shown in FIG. 1. In the following description, a memory cell is a cell including both the storage device 2 and the select MOS transistor 3.

First of all, the configuration of a portion serving as the storage device 2 is explained as follows.

To begin with, a nonmagnetic layer 23 is sandwiched between a ferromagnetic layer 22 and a ferromagnetic layer 24 in order to form an anti-ferromagnetic junction.

Then, the ferromagnetic layer 22 on the lower side is brought into contact with an anti-ferromagnetic layer 21 in order to provide strong one-directional magnetic anisotropy caused by an exchange interaction effect working between the anti-ferromagnetic layer 21 and the ferromagnetic layer 22.

Subsequently, a fixed-magnetization layer 15 having a fixed magnetization direction is configured to include, the anti-ferromagnetic layer 21, the ferromagnetic layer 22, the nonmagnetic layer 23 and the ferromagnetic layer 24. That is to say, the fixed-magnetization layer 15 includes the ferromagnetic layers 22 and 24 which are separated away from each other by the nonmagnetic layer 23. In general, however, the fixed-magnetization layer 15 may include a plurality of ferromagnetic layers (tow layers in this typical configuration), each two adjacent ones of which are separated away from each other by a nonmagnetic layer.

A ferromagnetic layer 26 has such a configuration that the orientation of the magnetization M1 thereof can be rotated relatively with ease. A storage layer 16 also referred to as a free-magnetization layer is constructed from this ferromagnetic layer 26. Information is stored in the storage layer 16 as the state of magnetization of the magnetic substance of the storage layer 16.

A tunnel insulation layer 25 is created between the ferromagnetic layer 24 of the fixed-magnetization layer 15 and the ferromagnetic layer 26, that is, between the fixed-magnetization layer 15 and the storage layer 16. The tunnel insulation layer 25 cuts a magnetic junction between the ferromagnetic layer 26 and the ferromagnetic layer 24 and plays a role as a layer for driving a tunnel current to flow. Thus, a TMR (Tunnel Magnetic Resistance effect) device is configured to include the fixed-magnetization layer 15 with the magnetic layers thereof having a fixed magnetization direction, the tunnel insulation layer 25 and the storage layer 16 with the magnetic layer thereof having a variable magnetization direction.

Finally, a storage device 2 is configured to have an underlayer 20 and a top coat layer 27 as well as the TMR device including layers ranging from the anti-ferromagnetic layer 21 to the ferromagnetic layer 26.

When a write current flows through the storage device 2 in the layer stacking direction, the orientation of the magnetization M1 of the storage layer 16 is changed to reflect information stored in the storage layer 16 by the write current.

The following materials can be used as materials for creating the layers composing the storage device 2.

A typical material for creating the anti-ferromagnetic layer 21 can be PtMn.

A ferromagnetic material such as CoFe can be used as a material for making the ferromagnetic layers 22 and 24 employed in the fixed-magnetization layer 15.

A material such as Ru, Ta, Cr or Cu can be used as a material for making the nonmagnetic layer 23 employed in the fixed-magnetization layer 15.

A material such as MgO can be used as a material for making the tunnel insulation layer 25.

A ferromagnetic material such as CoFeB can be used as a material for making the ferromagnetic layer 26 employed in the storage layer 16. In addition, the ferromagnetic material may be doped with a nonmagnetic element or a nonmagnetic material. As the nonmagnetic element or material with which the ferromagnetic material is doped, typically, it is possible to make use of Ru, Ta, Cr, Cu or MgO.

In a steady state, the anti-ferromagnetic junction formed by the nonmagnetic layer 23 sandwiched between the ferromagnetic layers 22 and 24 puts the magnetization M11 of the ferromagnetic layer 22 and the magnetization M12 of the ferromagnetic layer 24 in an almost completely anti-parallel state.

Normally, the ferromagnetic layers 22 and 24 are configured to have all but equal magnetic moments. Thus, a leak component of the polar magnetic field is so small that the component can be ignored.

The tunnel insulation layer 25 is sandwiched between the ferromagnetic layer 26 of the storage layer 16 and the ferromagnetic layer 24 of the fixed-magnetization layer 15. The resistance of the TMR device including the ferromagnetic layer 24, the tunnel insulation layer 25 and the ferromagnetic layer 26 changes in accordance whether the orientation of the magnetization M1 of the ferromagnetic layer 26 and the orientation of the magnetization M12 of the ferromagnetic layer 24 have been put in a parallel state or an anti-parallel state.

To put it concretely, if the orientation of the magnetization M1 and the orientation of the magnetization M12 have been put in a parallel state, the resistance of the TMR device decreases. If the orientation of the magnetization M1 and the orientation of the magnetization M12 have been put in an anti-parallel state, on the other hand, the resistance of the TMR device increases.

If the resistance of the TMR device changes, the resistance of the entire storage device 2 also changes as well. By this phenomenon, it is possible to write information into the storage device 2 or read out information from the storage device 2. For example, by assigning the low-resistance state of a storage device 2 to information of 0 and the high-resistance state of the storage device 2 to information of 1, it is possible to write binary 1-bit information into the storage device 2.

As described above, the ferromagnetic layer 24 is relatively close to the storage layer 16 in the fixed-magnetization layer 15. It is to be noted that the ferromagnetic layer 24 is also referred to as a referenced layer because, in an operation to read out information from the storage device 2, the ferromagnetic layer 24 serves as a ferromagnetic layer to be referenced as the reference of the orientation of the magnetization M1 of the storage layer 16.

In addition, the storage device 2 shown in FIG. 2 has the so-called in-plane magnetization configuration in which the magnetization M1, the magnetization M11 and the magnetization M12 exist on the planes of respectively the ferromagnetic layer 26, the ferromagnetic layer 22 and the ferromagnetic layer 24 which together form a stack. However, the storage device 2 can also be designed into the so-called perpendicular magnetization configuration in which the magnetization M1, the magnetization M11 and the magnetization M12 are oriented in a direction perpendicular to the planes of respectively the ferromagnetic layer 26, the ferromagnetic layer 22 and the ferromagnetic layer 24 which together form a stack. In the case of the perpendicular magnetization configuration, as materials for creating the ferromagnetic layers 26, 22 and 24, magnetic materials for making vertical magnetization films are used.

Typical examples of the material for making a vertical magnetization film are materials of the TePt, CoPt, FePt, TbFeCo, GdFeCo, CoPd, CoFeCr, MnBi, MnGa, PtMnSb and Co—Cr families. In addition, it is also possible to make use of a magnetic material other than these typical examples as a material for making a vertical magnetization film.

Next, the following description explains the configurations of the select MOS transistor 3 and the lines such as the bit line 12 electrically connected to the storage device 2.

The select MOS transistor 3 is created in a silicon substrate 30 whereas a connection plug 17 is created on a diffusion layer 33, which is one of two diffusion layers of the select MOS transistor 3.

The underlayer 20 of the storage device 2 is created on the connection plug 17.

A diffusion layer 32 which is the other diffusion layer of the select MOS transistor 3 is connected to a source line 13 by another connection plug not shown in FIG. 2.

The gate electrode 31 of the select MOS transistor 3 is connected to a word line 14 by a further connection plug not shown in FIG. 2.

The top coat layer 27 of the storage device 2 is connected to a bit line 12 provided on the top coat layer 27.

In order to write information into a memory cell and read out information already stored in a memory cell, it is necessary to generate a spin injection current Iz flowing into the storage device 2.

The spin injection current Iz flows through the diffusion layer 33, the connection plug 17, the storage device 2 and the bit line 12.

By the way, the flowing direction of the spin injection current Iz can be inverted. That is to say, the flowing direction of the spin injection current Iz can be changed from an upward direction to a downward direction or from the downward direction to the upward direction.

By inverting the flowing direction of the spin injection current Iz, the direction of the magnetization M1 of the storage layer 16 can be inverted in order to rewrite information stored in the memory cell.

Operation to Write Information into Storage Device

Next, by referring to FIG. 1, the following description explains a typical operation carried out by a write section to write information into a storage device 2.

The row decoder 6 selects a specific word line 14 from all word lines 14 (for example, 512 word lines 14) of the entire cell array 5 in accordance with a row address and sets a voltage appearing on the specific word line 14 at a power-supply voltage. In this way, the row decoder 6 puts a select MOS transistor 3 connected to the specific word line 14 in a turned-on state.

The column switch 7 provided on the upper side selects a specific source line 13 from all source lines 13 (for example, 512 source lines 13) of the entire cell array 5 in accordance with a column address and connects the specific source line 13 to the SL write driver 8.

By the same token, the column switch 7 provided on the lower side selects a specific bit line 12 from all bit lines 12 (for example, 512 bit lines 12) of the entire cell array 5 in accordance with the column address and connects the specific bit line 12 to the BL write driver 9.

For a data input of 1, the SL write driver 8 asserts the write voltage on the source line 13. For a data input of 0, on the other hand, the SL write driver 8 asserts the ground voltage on the source line 13.

Conversely, for a data input of 0, the BL write driver 9 asserts the write voltage on the bit line 12. For a data input of 1, on the other hand, the SL write driver 8 asserts the ground voltage on the bit line 12.

In this way, the direction of the current flowing through the bit line 12, the storage device 2, the select MOS transistor 3 and the source line 13 can be changed in accordance with the data input. Thus, it is possible to carry out an operation to write information of 0 or 1 representing the data input onto the storage device 2.

It is to be noted that the operation carried out by the write section is not limited to the typical write operation described above. That is to say, the operation carried out by the write section can be implemented in a different way.

Operation to Read Out Information from Storage Device

Next, by referring to FIG. 1, the following description explains a typical operation carried out by the sense amplifier 10 to read out information from a storage device 2.

A word line 14 is selected in the same way as the operation to write information to the storage device 2 as described above.

The column switch 7 provided on the upper side selects a specific bit line 12 from all bit lines 12 (for example, 512 bit lines 12) of the entire cell array 5 in accordance with a column address and connects the specific bit line 12 to the SL write driver 8.

By the same token, the column switch 7 provided on the lower side selects a specific source line 13 from all source lines 13 (for example, 512 source lines 13) of the entire cell array 5 in accordance with the column address and connects the specific source line 13 to the sense amplifier 10.

The SL write driver 8 always asserts the ground voltage on the bit line 12.

In the connections described above, a constant read current flows from the sense amplifier 10 the storage device 2.

Let V1 denote a sensed voltage as a voltage representing the read current in a state in which information of 1 has been stored in the storage device 2 and has set the resistance of the storage device 2 at a large value. By the same token, let V0 denote a sensed voltage as a voltage representing the read current in a state in which information of 0 has been stored in the storage device 2 and has set the resistance of the storage device 2 at a small value.

Since the sensed voltage V1 is a voltage representing a read current for the high resistance whereas the sensed voltage V0 is a voltage representing a read current for the low resistance, the relation V1>V0 holds true. In order to read out information from the storage device 2, a reference voltage higher than V0 but smaller than V1 is supplied to the sense amplifier 10.

The sense amplifier 10 compares the sensed voltage with the reference voltage. A sensed voltage found higher than the reference voltage indicates that the information of 1 has been stored in the storage device 2. On the other hand, a sensed voltage found lower than the reference voltage indicates that the information of 0 has been stored in the storage device 2. That is to say, it is possible to carry out an operation to read out information from the storage device 2.

It is to be noted that the operation to read out information is not limited to the typical read operation described above. That is to say, the operation carried to read out information can be implemented in a different way.

3: Embodiment Implementing the Storage Apparatus According to the Embodiment of the Disclosure Next, by referring to FIG. 3, the following description explains an embodiment implementing a storage apparatus according to an embodiment of the present disclosure.

Also in the case of the embodiment implementing a storage apparatus according to an embodiment of the present disclosure, the cell array 5 has storage devices 2 laid out to form an array. However, the cell array 5 has a configuration obtained by dividing the cell array 5 into a plurality of blocks each referred to hereafter as a cell block. In addition, the storage layer 16 of every storage device 2 is configured to have a thermal stability peculiar to the cell block including the storage device 2.

The storage layer 16 can be configured to have a thermal stability peculiar to the cell block including the storage device 2 by setting the saturated magnetization of the ferromagnetic layer 26 of the storage layer 16 at a level peculiar to the cell block. As an alternative, the storage layer 16 can be so configured by setting the magnetic anisotropy constant of the ferromagnetic layer 26 at a value peculiar to the cell block. As another alternative, the storage layer 16 can be so configured by combining the saturated magnetization set at the level peculiar to the cell block and the magnetic anisotropy constant set at the value peculiar to the cell block.

The saturated magnetization of a ferromagnetic layer can be changed by modifying the composition of the ferromagnetic layer. For example, the magnetic material of a ferromagnetic layer is doped with a nonmagnetic material in order to reduce the saturated magnetization of the ferromagnetic layer.

It is possible to conceive a configuration in which, for example, magnetic materials with different magnetic anisotropy constants are used for making ferromagnetic layers having different magnetic anisotropy constants.

Figure 3:
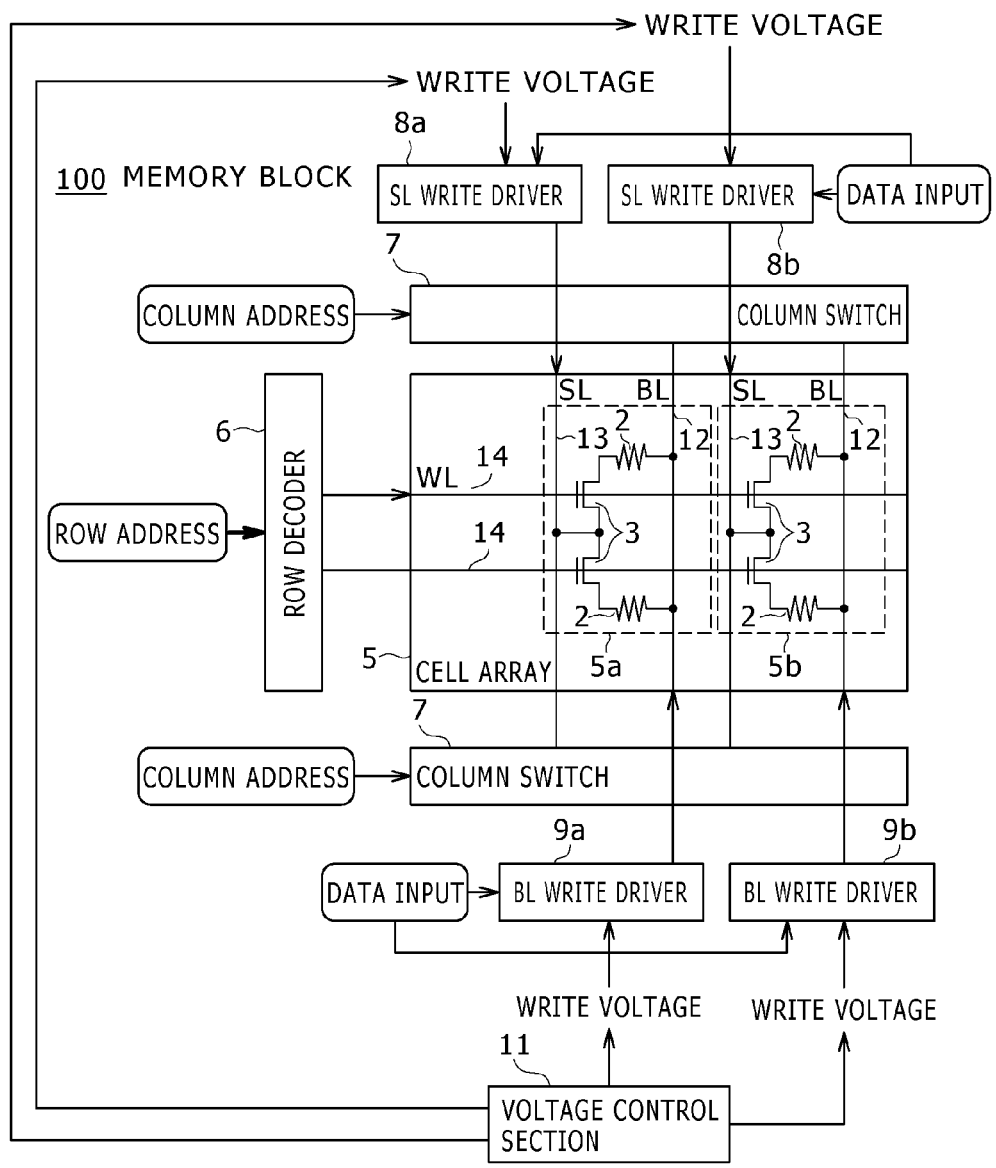
FIG. 3 is a functional block diagram showing a typical internal configuration of a storage apparatus according to an embodiment of the present disclosure.

FIG. 3 is a functional block diagram showing a typical internal configuration of a storage apparatus according to the embodiment of the present disclosure.

A memory block 100 shown in FIG. 3 is the storage apparatus according to the embodiment of the present disclosure. As shown in the figure, the memory block 100 includes a cell array 5 divided into two cell blocks, i.e., cell blocks 5a and 5b.

The thermal stability of the storage layer 16 of every storage device 2 included in the cell block 5a on the left-hand side of the figure is different from the thermal stability of the storage layer 16 of every storage device 2 included in the cell block 5b on the right-hand side of the figure.

In addition, in the configuration shown in FIG. 3, a circuit for carrying out a write operation on the cell block 5a is different from a circuit for carrying out a write operation on the cell block 5b.

To put it concretely, an SL write driver 8a and a BL write driver 9a supply a write voltage to the cell block 5a whereas an SL write driver 8b and a BL write driver 9b supply a write voltage to the cell block 5b. The write voltages are generated by a voltage control section 11 independently of each other.

The reader is advised to keep in mind that it is also possible to provide a configuration in which an SL write driver and a BL write driver are shared by a plurality of cell blocks. In such a configuration, when a write operation is switched from one cell block to another, the voltage control section 11 changes the write voltages. Since it takes some time for the write voltages to get stabilized, however, this configuration has a demerit of a longer write time.

Figure 4:
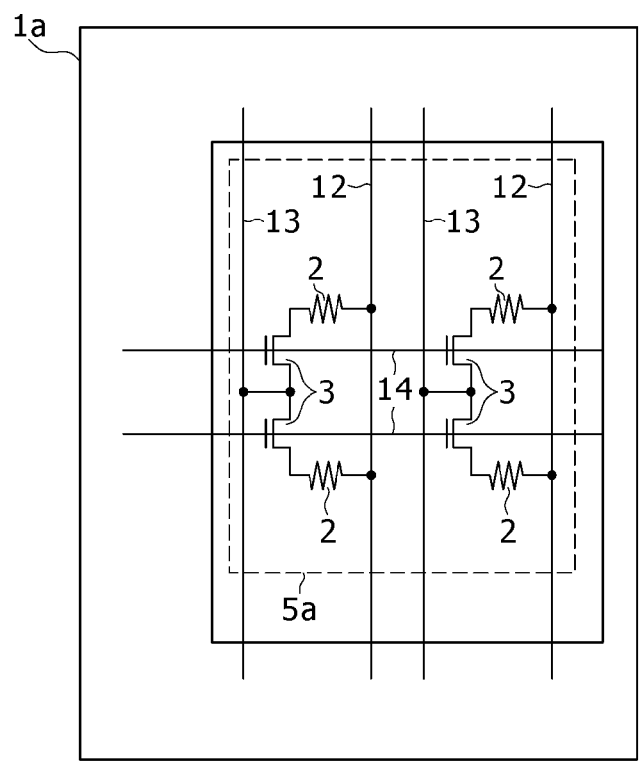
FIG. 4 is a plurality of diagrams to be referred to in description of another implementation of a method for dividing a cell array into a plurality of cell blocks.
Figure 4:
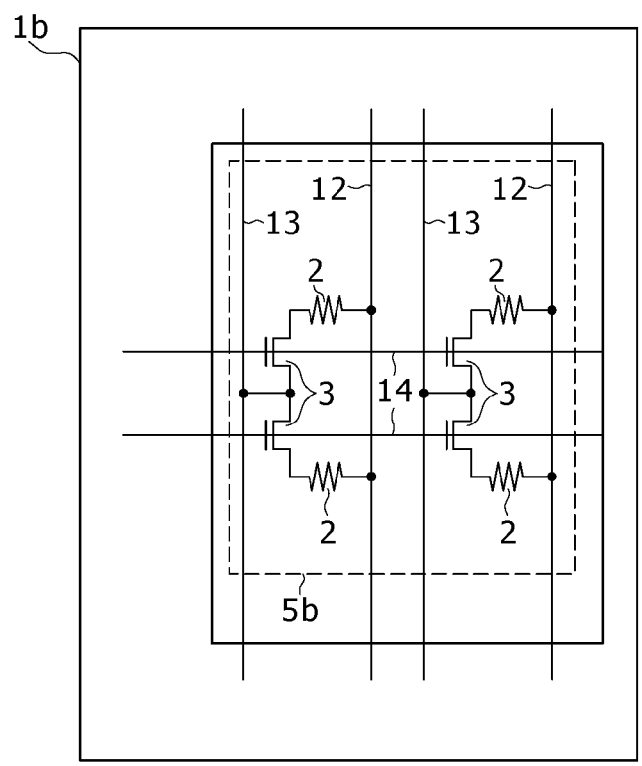

FIG. 4 is a plurality of diagrams to be referred to in description of another implementation of a method for dividing a cell array into a plurality of cell blocks.

The configuration shown in FIG. 4 has two memory blocks 1a and 1b. The entire cell array of each of the memory blocks 1a and 1b is used as a cell block. That is to say, the memory block 1a has a cell block 5a whereas the memory block 1b has a cell block 5b. Also in this configuration, the thermal stability of the storage layer 16 of every storage device 2 included in the cell block 5a is different from the thermal stability of the storage layer 16 of every storage device 2 included in the cell block 5b.

It is to be noted that, as shown in none of the figures, configuration components such as the row decoder 6 and the column switch 7 shown in FIG. 1 except the cell array 5 are included in each of the memory blocks 1a and 1b shown in FIG. 4.

In the case of the configuration shown in FIG. 3, the entire cell array 5 is created on the same wafer.

In the case of the configuration shown in FIG. 4, on the other hand, the memory blocks 1a and 1b can be created on the same wafer or on two different wafers provided for the memory blocks 1a and 1b.

Next, the following description explains operations carried out by the storage apparatus in which the cell array 5 is divided into a plurality of cell blocks, i.e., the cell blocks 5a and 5b.

Figure 5:
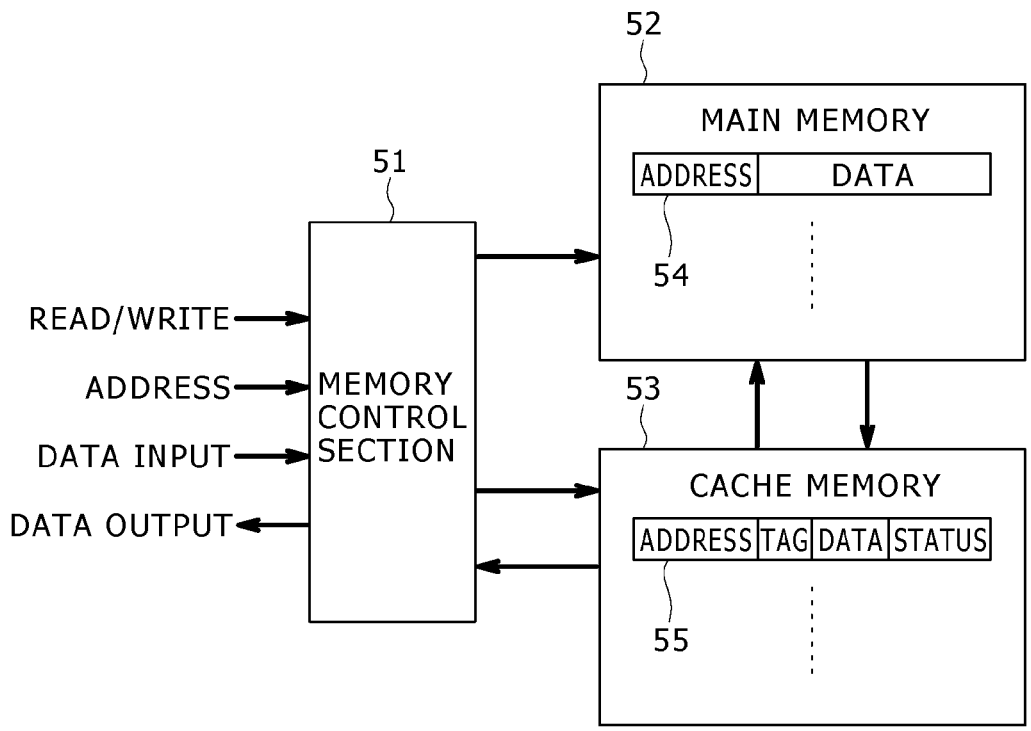
FIG. 5 is a conceptual diagram to be referred to in description of operations carried out for a case in which a cell array is divided into two cell blocks.

FIG. 5 is a conceptual diagram to be referred to in description of operations carried out for a case in which a cell array is divided into two cell blocks.

A cell block and configuration components shown in FIG. 1 except the cell array 5 function as a memory based on the cell block. As shown in FIG. 1, the configuration components other than the cell array 5 are components surrounding the cell block include the row decoder 6 and the column switch 7.

In the case of the configuration shown in FIG. 5, the two cell blocks are referred to as a main memory 52 and a cache memory 53.

The main memory 52 is used for storing a piece of data for every address in the main memory 52 at the address. In the following description, an address in the main memory 52 is referred to as an in-memory address.

On the other hand, the cache memory 53 is used for storing a tag, a piece of data and a status bit for every address in the cache memory 53 at the address in the cache memory 53.

With the main memory 52 and the cache memory 53 configured as described above, it is possible to apply a generally and widely used technology such as a disc-cache or page-cache technology.

The following description briefly explains an operation method adopting the technology.

A memory control section 51 controls electrical connections with components external to the storage apparatus as well as control of the main memory 52 and the cache memory 53.

In the event of a requested read or write access to an in-memory address, first of all, the memory control section 51 determines whether or not a piece of data stored at the in-memory address exists in the cache memory 53 by comparing a portion of the in-memory address specified in the requested access with the tag stored at every address in the cache memory 53.

If the portion of the in-memory address specified in the access matches the tag stored at an address in the cache memory 53, the piece of data stored at the address in the cache memory 53 is read out from the cache memory 53 or the piece of data stored at the address in the cache memory 53 and the piece of data stored at the in-memory address are updated by a piece of data specified in the access.

If the portion of the in-memory address specified in the access made as a read access does not match any tag, on the other hand, the memory control section 51 determines that the piece of data stored at the in-memory address does not exist in the cache memory 53. In this case, the piece of data stored at the in-memory address is transferred from the main memory 52 to a free area in the cache memory 53. If no free area is available in the cache memory 53, a piece of data stored in the cache memory 53 is selected and transferred to the main memory 52 in order to create a free area.

If the piece of data stored in the cache memory 53 to be transferred to the main memory 52 has not been updated, it is not necessary to transfer the piece of data to the main memory 52 because the main memory 52 has the copy of the piece of data. The memory control section 51 is capable of determining whether or not a piece of data stored in the cache memory 53 has been updated by recognizing the status bit associated with the piece of data.

The cache technology described above is effective because of the so-called access locality. The access locality means that, if a piece of data stored at a specific in-memory address is accessed, it is quite within the bounds of possibility that the piece of data and other pieces of data stored at in-memory addresses close to the specific in-memory address are accessed again in the near future.

In accordance with the ordinary cache technology, a memory having a short access time (or a fast latency) is used as the cache memory for storing as much frequently accessed data as possible. In this way, the cache memory can be used for compensating the large-capacity main memory for a slow latency existing in the main memory as a defect of the main memory.

The method adopted by the storage apparatus according to this embodiment to make use of a cache memory is different from the method adopted by existing storage apparatus to make use of a cache memory in that, in the case of the storage apparatus according to this embodiment, the cell array 5 is divided into a first cell block including storage devices each having a thermal stability peculiar to the first cell block and a second cell block including storage devices each having a thermal stability which is peculiar to the second cell block and is different from the thermal stability peculiar to the first cell block and, in addition, the first and second cell blocks are used as the main and cache memories respectively.

The cache and main memories are different from each other in the following two points.

In the first place, the number of write operations carried out on the cache memory is different from the number of write operations carried out on the main memory. That is to say, every time a write operation is requested, the write operation is carried out on the cache memory. On the other hand, a write operation is carried out on the main memory to transfer a piece of data from the cache memory to the main memory in order to create a free area in the cache memory only when there is no longer free area in the cache memory.

In the second place, the length of time for holding data in the cache memory is different from the length of time for holding data in the main memory. In the case of a nonvolatile memory, the main memory is required to have a data holding time period of typically ten years whereas the cache memory is required to have no long data holding time period due to the functional property of the cache memory. The reader is advised to keep in mind that it is possible to provide a configuration in which a time with a length extended to a certain degree such as typically 1 second is set as the maximum length of the data holding time for the cache memory by rewriting the same data on the cache memory after the time has elapsed.

4: Error Rates of the Storage Apparatus

Next, on the basis of the theory of a spin transfer phenomenon, the following description explains merits of applying the cache technology described above to the ST-MRAM.

First of all, error rates of the ST-MRAM are explained. The ST-MRAM has error rates of errors attributed to a variety of causes. The following description explains a destruction error rate of errors generated in a write operation carried out on the storage device 2 and a data holding time error rate of errors generated during a data holding time.

Write Operation Destruction Error Rate

First of all, the following description explains a destruction error rate in a write operation.

When a write voltage is applied to a memory cell, electric-field stress is developed in the tunnel insulation layer 25 of the storage device 2. Strong electric-field stress at last causes electrostatic destruction to the tunnel insulation layer 25.

The electrostatic destruction of the tunnel insulation layer 25 is modeled as explained as follows.

Let us consider a case in which the write section applies a certain write voltage to the storage device 2 repeatedly.

The probability $r_{bd}$ that the storage device 2 is destructed before the write voltage is applied to the storage device 2 for the xth time is expressed by Eq. (1) given as follows:

$$r_{bd} = 1 - \exp(-(x/\mu)^\beta) \quad (1)$$

Eq. (1) expresses a Weibull distribution. Reference notation $\beta$ represents the shape of the distribution. In the case of the storage device 2 used in an ST-MRAM, the distribution shape $\beta$ has a value approximately in the range 1 to 2. Reference notation $\mu$ denotes an average executable write operation count and is dependent on the write voltage.

The dependence of the average executable write operation count $\mu$ on the write voltage can be described as a low-power model and expressed by Eq. (2) given as follows:

$$\mu = x_1 \cdot V^{-b} \quad (2)$$

In the above equation, reference notation $x_1$ denotes the average executable write operation count $\mu$ for a write voltage of 1 V whereas reference notation b denotes a parameter used for determining the dependence of the average executable write operation count $\mu$ on the write voltage.

Normally, the average executable write operation count $x_1$ has a value approximately in the range $10^4$ to $10^{10}$ whereas the parameter b has a value approximately in the range 40 to 60.

As is obvious from Eq. (2), the higher the write voltage, the smaller the average executable write operation count $\mu$. Thus, the higher the write voltage, the larger the destruction probability also referred to hereafter as a destruction error rate. For this reason, it is desirable to carry out an operation to write information on a memory cell by applying a low write voltage to the storage device 2 in order to reduce the destruction error rate.

Data Holding Time Error Rate

Next, the data holding time error rate is explained.

The state of data already stored in a nonvolatile memory must be sustained as it is even after the power supply of the memory is turned off.

In general, at a guaranteed-operation temperature of typically 85 degrees Celsius, a nonvolatile memory is required to be capable of sustaining the state of data already stored in the nonvolatile memory as it is for 10 years.

In the so-called data holding time error phenomenon, due to magnetization inversion caused by thermal fluctuations, the state of information stored in the ST-MRAM is inadvertently changed.

The frequency at which magnetization is inverted due to thermal fluctuations is referred to as thermal stability indicator Δ. The thermal stability indicator Δ is expressed by Eqs. (3a) and (3b) given as follows:

$$\Delta = \frac{K_u V}{k_B T} + \frac{\mu_0 M_s^2 V}{2k_B T}(N_y - N_x) \qquad (3a)$$

$$\Delta = \frac{K_u V}{k_b T} - \frac{\mu_0 M_s^2 V}{2k_B T}(N_z - N_x) \qquad (3b)$$

Eqs. (3a) and (3b) are provided for the in-plane magnetization configuration and the perpendicular magnetization configuration respectively. In the equations given above, reference notation $K_u$ denotes the magnetic anisotropy constant of the storage layer 16, reference notation V denotes the volume of the storage layer 16, reference notation $M_s$ denotes the saturated magnetization of the storage layer 16, reference notations ($N_x$, $N_y$, $N_z$) denote demagnetization coefficients of the storage layer 16, reference notation $\mu_0$ denotes the magnetic permeability of the vacuum, reference notation Kb denotes the Boltzmann constant and reference notation T denotes the absolute temperature. Subscripts (x, y, z) denote the 3-dimensional space coordinate directions of the demagnetization coefficients, subscripts (x, y) denote the 2-dimensional plane directions of the stacked-layer surfaces and subscript z denotes the direction perpendicular to the 2-dimensional plane of every stacked-layer surface.

The thermal stability indicator Δ is a ratio of an energy required for inverting the magnetization M1 of the storage layer 16 to the thermal energy. The larger the thermal stability indicator Δ, the more excellent the data holding characteristic. In the following description, the energy required for inverting the magnetization M1 of the storage layer 16 is also referred to as an energy barrier.

In the case of the in-plane magnetization configuration corresponding to Eq. (3a), the magnetic anisotropy constant $K_u$ of the storage layer 16 is generally so small that the magnetic anisotropy constant $K_u$ can be ignored. Thus, the thermal stability indicator Δ is mainly determined by the second term of the expression on the right-hand side of Eq. (3a). In this case, if it is assumed that the relation (y-direction length<x-direction length) holds true, in order to assure a thermal stability indicator Δ of at least equal to 0, the relation $N_y > N_x$ is required to hold true. Thus, it is nice to have an elliptical or rectangular 2-dimensional shape on the (x, y) surface of the storage layer 16.

The energy barrier obtained in this way is referred to as a shape magnetic anisotropy energy. The shape magnetic anisotropy energy is proportional to the square of the saturated magnetization $M_s$.

In the case of the perpendicular magnetization configuration corresponding to Eq. (3b), on the other hand, in order to assure a thermal stability indicator Δ of at least equal to 0, a sufficiently large magnetic anisotropy constant $K_u$ is required. In this case, the so-called crystal magnetic anisotropy energy is used. The technical term "crystal magnetic anisotropy energy" is derived from the crystal structure of the magnetic layer.

The second term of the expression on the right-hand side of Eq. (3b) is referred to as a demagnetization term decreasing the thermal stability indicator Δ. In addition, in the case of the perpendicular magnetization configuration, it is not necessary to make use of the shape magnetic anisotropy energy.

Thus, in a number of cases, the shape on the (x, y) surface of the storage layer 16 is circular or square. In this case, the relation $N_y = N_x$ holds true.

The main term determining the thermal stability indicator Δ is the magnetic anisotropy energy.

In the case of the in-plane magnetization configuration, the shape magnetic anisotropy caused by the device shape is used but, in the case of the perpendicular magnetization configuration, the crystal magnetic anisotropy caused by the crystal structure is used.

It is to be noted, in the in-plane magnetization configuration making use of the shape magnetic anisotropy, the thermal stability indicator is proportional to the square of the saturated magnetization $M_s$ of the magnetization M1 experienced by the storage layer 16.

If the thermal stability indicator Δ is given, the data holding time error rate can be computed.

The probability $r_{ret}$ that magnetization is inverted due to thermal fluctuations during a time t [ns] is expressed by Eq. (4) given as follows:

$$r_{ret} = 1 - \exp(-t \cdot \exp(-\Delta)) \qquad (4)$$

Normally, the probability $r_{ret}$ has a value much smaller than 1. Thus, the probability $r_{ret}$ can be approximated by Eq. (5) given as follows:

$$r_{ret} = t \cdot \exp(-\Delta) \qquad (5)$$

Next, the following description explains the fact that the thermal stability indicator Δ and the write voltage are closely related to each other.

In the spin transfer phenomenon, there is a threshold-value current $I_{c0}$ that has a magnitude equal to or greater than that required to invert magnetization.

In accordance with the spin transfer theory, the relations between the threshold-value current $I_{c0}$ and the thermal stability indicator Δ are expressed by Eqs. (6a) and (6b) given as follows:

$$I_{c0} = \left(\frac{4ek_B T}{\hbar}\right)\left(\frac{\alpha\Delta}{\eta}\right)\left(1 + \frac{N_z}{2(N_y - N_x)}\right) \qquad (6a)$$

$$I_{c0} = \left(\frac{4ek_B T}{\hbar}\right)\left(\frac{\alpha\Delta}{\eta}\right)_= \qquad (6b)$$

Eqs. (6a) and 6(b) hold true for the in-plane magnetization configuration and the perpendicular magnetization configuration respectively. In the equations given above, reference notation e denotes the electrical charge of the electron, reference notation barred h denotes the conversion Planck constant, reference notation α denotes a damping constant, reference notation η denotes the spin injection efficiency whereas reference notations $N_x$, $N_y$ and $N_z$ denote demagnetization coefficients of the storage layer 16.

The required minimum write voltage $V_{c0}$ is expressed by the equation $V_{c0} = R \cdot I_{c0}$ where reference notation R denotes the resistance of the storage device 2.

That is to say, the write voltage is proportional to the thermal stability indicator Δ. Thus, if the thermal stability indicator Δ is increased in order to improve the data holding characteristic, the increased thermal stability indicator Δ inadvertently introduces a side effect of a required high write voltage.

As described above, in the ST-MRAM, the dependence of the data holding time error rate on the write voltage is the inverse of the dependence of the destruction error rate on the write voltage. Thus, it is obvious that a tradeoff between the data holding time error rate and the destruction error rate is requisite.

In order to implement the tradeoff, as is the case with the storage apparatus according to the embodiment, the cell array 5 is divided into a plurality of cell blocks, i.e., the cell blocks 5a and 5b. Then, the thermal stability indicator Δ of the storage layer 16 of each storage device 2 included in the cell block 5a is made peculiar to the cell block 5a whereas the thermal stability indicator Δ of the storage layer 16 of each storage device 2 included in the cell block 5b is made peculiar to the cell block 5b so that the thermal stability indicators Δ are different from each other. Thus, the number of write operations that can be carried out on a cell block with the lower thermal stability indicator Δ can be increased.

That is to say, in a specific one of the cell blocks 5a and 5b, the thermal stability indicator Δ of the storage layer 16 of each storage device 2 is set at a small value. Thus, in this specific cell block, a low write voltage can be applied in order to store information into a memory cell. As a result, the number of write operations executable on this specific cell block can be increased.

In the other one of the cell blocks 5a and 5b, on the other hand, the thermal stability indicator Δ of the storage layer 16 of each storage device 2 is set at a large value in order to improve the data holding characteristic. Thus, it is difficult to update information already stored in the other cell block. As a result, the information already stored in the other cell block can be sustained for a long time.

As described above, the cell array 5 is divided into a plurality of cell blocks, i.e., the cell blocks 5a and 5b. Then, the thermal stability indicator Δ of the storage layer 16 of each storage device 2 included in the cell block 5a is made peculiar to the cell block 5a whereas the thermal stability indicator Δ of the storage layer 16 of each storage device 2 included in the cell block 5b is made peculiar to the cell block 5b so that the thermal stability indicators Δ are different from each other.

In a specific one of the cell blocks 5a and 5b, the thermal stability indicator Δ of the storage layer 16 of each storage device 2 is set at a small value. Thus, in this specific cell block, a small write current can be generated to flow to a memory call in order to store information into the memory cell. As a result, the number of write operations that can be carried out on this specific cell block can be increased. In the other one of the cell blocks 5a and 5b, on the other hand, the thermal stability indicator Δ of the storage layer 16 of each storage device 2 is set at a large value in order to allow information already stored in the other cell block to be sustained for a long time.

As a result, it is possible to implement a storage apparatus allowing the number of executable write operations to be increased and already stored information to be sustained for a long time.

5: ECC (Error Correction Codes)

The storage apparatus implemented by the embodiment described above to serve as a storage apparatus according to an embodiment of the present disclosure may make use of error correction codes.

An error correction code includes a parity bit appended to information bits. By the parity bit, a generated bit error can be detected and corrected.

In the storage apparatus according to an embodiment of the present disclosure, for example, an ECC can be used to detect and correct a data holding time error described above. The ECC is used in at least one of a plurality of cell blocks each including storage devices each having a storage layer provided with a thermal stability peculiar to the cell block.

Next, the following description explains how the data holding time error rate changes when the ECC is used as described above.

In the following description, reference notation N denotes the capacity of the memory used as the storage apparatus, reference notation n denotes an ECC code bit count, reference notation k denotes an ECC information bit count, reference notation s denotes an error correction bit count and reference notation b (=N/k) denotes a block count.

Let reference notation $R_b$ denote the data holding time error rate of one code block for the time t[ns]. Since the data holding time error rate $R_b$ is the probability that at least (s+1) bits cause data holding time errors at the same time, the data holding time error rate $R_b$ can be expressed by Eq. (7) given as follows:

$$R_b = {}_nC_{s+1}(r_{ret})^{s+1} + {}_nC_{s+2}(r_{ret})^{s+2} + \quad (7)$$

Since the probability $r_{ret}$ is much smaller than 1, the data holding time error rate $R_b$ can be approximated by Eq. (8) given as follows:

$$R_b = {}_nC_{s+1}(r_{ret})^{s+1} \quad (8)$$

In Eqs. (7) and (8) given above, reference notation ${}_nC_m$ denotes the number of ways in which m items can be selected from n items. The integer ${}_nC_m$ represents coefficients of a binomial expression.

Next, the data holding time error rate of the entire memory is considered.

It is assumed that the entire memory is required to sustain data already stored in the entire memory as it is for ten years. The data holding time error rate $R_d$ for the period of ten years is expressed by Eq. (9) given below. In the following description, the data holding time error rate $R_d$ is also referred to as a device error rate.

$$R_d = {}_nC_{s+1}(N/k)(t_{10}/t)(r_{ret})^{s+1} \quad (9)$$

The above equation is an approximation obtained by assuming that the probability $r_{ret}$ is much smaller than 1. In the above equation, reference notation $t_{10}$ denotes a period of ten years, that is, $t_{10}$=ten years=$3.2 \times 10^{17}$ ns. Reference notation t denotes the write interval. The expression on the right-hand side of Eq. (5) is substituted into Eq. (9) as a replacement for the probability $r_{ret}$ in order to yield Eq. (10) given as follows:

$$R_d = {}_nC_{s+1}(N/k)(t_{10} \cdot t^s)(\exp(-(s+1)\Delta)) \quad (10)$$

If the ECC is not used, equations n=k and s=0 hold true. Thus, the data holding time error rate $R_d$ is expressed by Eq. (11) given as follows.

$$R_d = N \cdot t_{10} \cdot \exp(-\Delta) \quad (11)$$

Eq. (11) given above is the single-bit 10-year data holding error rate extended for N bits.

As is obvious from Eq. (11), if the ECC is not used, the device error rate $R_d$ is not dependent on the write interval t.

If the ECC is used, on the other hand, as is obvious from Eq. (10), the existence of the term $t^s$ in Eq. (10) changes the device error rate $R_d$ in such a way that, the shorter the write interval t, the smaller the device error rate $R_d$.

6: Typical Computations

Next, the following description explains typical concrete computations to calculate the number of write operations that can be carried out on the ST-MRAM and calculate the thermal stability indicators on the basis of the destruction error rate and the data holding time error rate which have been explained above.

First of all, the following description explains a typical concrete computation to calculate the number of write operations.

Figure 6:
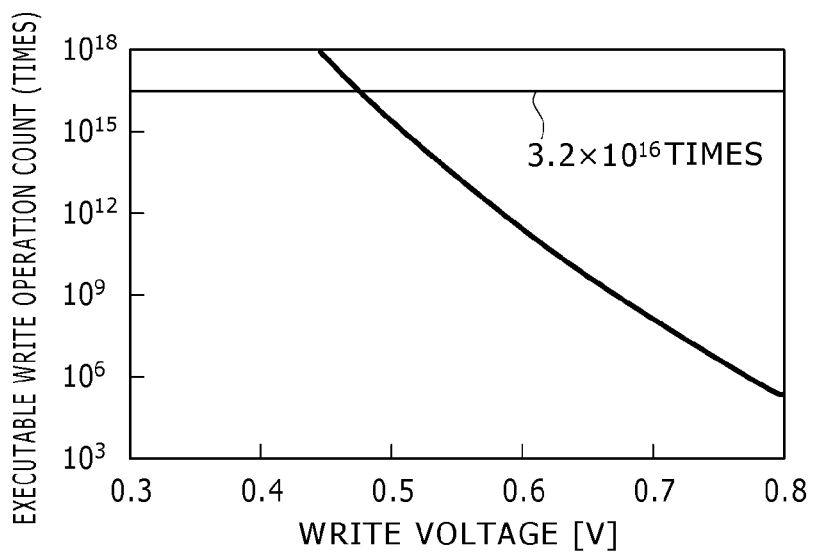
FIG. 6 is a diagram showing a relation between a write voltage and the number of executable write operations.

FIG. 6 is a diagram showing a relation between the write voltage and the number of executable write operations.

It is to be noted that the number of executable write operations is the number of executable write operations for which the destruction error rate is equal to 1/memory storage capacity. That is to say, the number of executable write operations is the number of executable write operations that can be carried out till the most destructible bit in the memory is destructed. In this case, the average executable write operation count x1 is $2 \times 10^8$, the block count b is 50, the distribution shape $\beta$ is 1 and the memory capacity N is 64 Mbit.

In FIG. 6, the executable write operation count of $3.2 \times 10^{16}$ is the number of write operations carried out on 1 bit at a cycle of 10 ns continuously for a period of ten years. If the number of executable write operations is equal to or greater than $3.2 \times 10^{16}$, the number of write operations that can be carried out on the storage device is virtually infinite during the life of the device. The write voltage providing the executable write operation count of $3.2 \times 10^{16}$ is 480 mV. At write voltages equal to or higher than 480 mV, the number of write operations is finite.

As is obvious from FIG. 6, the dependence of the number of executable write operations on the write voltage is represented by a very steep curve showing that, at a write voltage of 700 mV, the number of executable write operations is undesirably reduced to $1.7 \times 10^8$.

Next, the following description explains a typical concrete computation to calculate the thermal stability indicator.

Figure 7A:
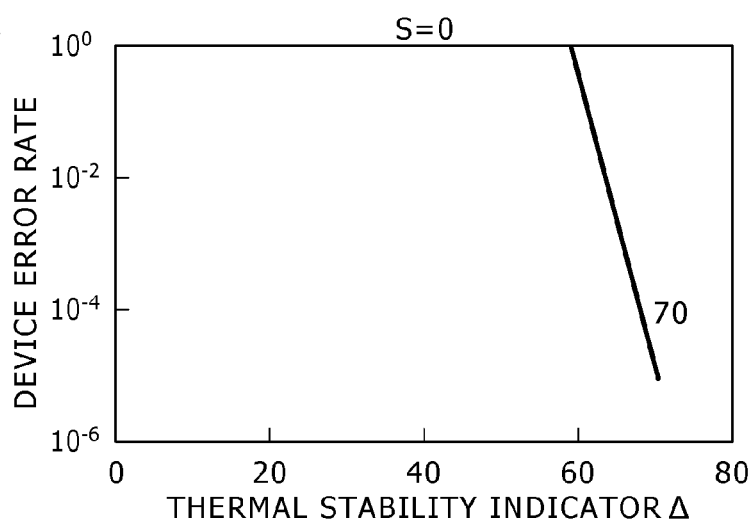
FIGS. 7A to 7C are diagrams showing relations between a thermal stability indicator and a device-error rate for different error-correction bit counts.
Figure 7B:
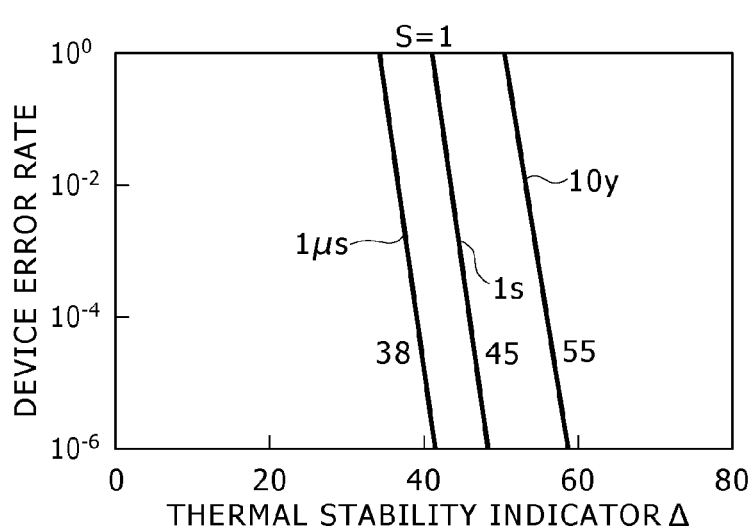
Figure 7C:
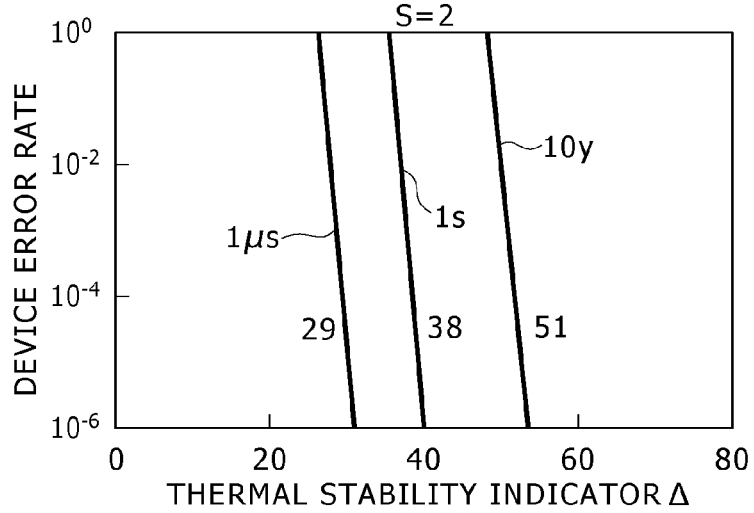

FIGS. 7A to 7C are diagrams showing relations between the thermal stability indicator and the device error rate for different error-correction bit counts. To be more specific, FIG. 7A shows such a relation obtained for a case in which no ECC is used. FIG. 7B shows such relations obtained for a case in which the number of bits usable for correcting an error is 1. FIG. 7C shows such relations obtained for a case in which the number of bits usable for correcting an error is 2. The BCH code was used as the ECC. In addition, in the case of FIGS. 7B and 7C, the curves each representing such a relation were obtained for write intervals of 1 s (one microsecond), 1s (one second) and 10 y (ten years). It is to be noted that the horizontal axis of each of the figures represents the thermal stability indicator $\Delta$ for a device error rate of $10^{-4}$.

As explained earlier, when the ECC is not used, the device error rate is not dependent on the write interval. Thus, if a device error rate of $10^{-4}$ is requested for example, the required thermal stability indicator $\Delta$ is 70 as shown in FIG. 7A.

When the ECC is used, on the other hand, as is obvious from FIGS. 7B and 7C, the larger the number of bits usable for correcting an error and the shorter the write interval, the smaller the required thermal stability indicator $\Delta$.

As explained earlier, the data holding time of the cache memory is short. Since the data holding time of the cache memory is short, by introducing the ECC to the cache memory, the device error rate can be sustained even if the thermal stability indicator $\Delta$ is small. If the thermal stability indicator $\Delta$ is small, the write voltage can be lowered. Thus, it is obvious that the destruction error rate of the cache memory can be reduced.

In order to obtain a concrete relation between the thermal stability indicator $\Delta$ and the write voltage, computation based on a macro spin model was carried out. In this case, the storage device was designed into an in-plane magnetization configuration. The planar shape of the storage device was made elliptical. The ECC was not used in the main memory. The computation was carried out for a first cache memory for which the number of bits usable for correcting an error is 1 and a second cache memory for which the number of bits usable for correcting an error is 2. For both the first and second cache memories, the data holding time was set at 1 s. Results of the computation are shown in Table 1.

TABLE 1

| Name | Symbol | Range of typical values | Main memory | First cache memory | Second cache memory | Unit |
|---|---|---|---|---|---|---|
| Thermal stability indicator | $\Delta$ | 50 to 100 | 70 | 45 | 38 | — |
| Damping constant | $\alpha$ | 0.01 to 0.04 | 0.02 | 0.02 | 0.02 | — |
| Spin injection efficiency | $\eta$ | 0.3 to 0.8 | 0.7 | 0.7 | 0.7 | — |
| Saturated magnification | $M_s$ | 300 to 800 | 489 | 392 | 361 | emu/cc |
| Area resistance | RA | 7 to 30 | 12 | 12 | 12 | $\Omega\mu m^2$ |
| Device size | W × L | — | 70 × 210 | 70 × 210 | 70 × 210 | nm |
| Inverting current | $I_{c0}$ | — | 516 | 332 | 280 | $\mu A$ |
| Inverting voltage | $V_{c0}$ | — | 536 | 345 | 291 | mV |
| Write voltage | Vc | — | 724 | 466 | 393 | mV |

From the results shown in FIGS. 7A to 7C, the thermal stability indicators $\Delta$ required for the first and second cache memories have been found to be 45 and 38 respectively.

As described above, in order to change the thermal stability indicator $\Delta$, it is necessary to change the saturated magnetization $M_s$ of the ferromagnetic layer 26 of the storage layer 16. It is to be noted that, in order to actually reduce the saturated magnetization $M_s$ of a ferromagnetic layer, it is necessary for example to dope the ferromagnetic layer with a nonmagnetic element.

If a typical damping constant $\alpha$ of 0.02 and a typical spin injection efficiency $\eta$ of 0.7 are used, as shown in Table 1, the inverting voltages $V_{c0}$ are 536 mV for the main memory, 345 mV for the first cache memory and 291 mV for the second cache memory.

It is to be noted, however, that the inverting voltage $V_{c0}$ is a minimum voltage required for inverting the magnetization of a ferromagnetic layer. Thus, if variations from storage device to storage device are taken into consideration, it is desirable to carry out write operations by applying inverting voltages $V_{c0}$ with magnitudes greater than the values shown in the table to the storage devices.

Inventors of the present disclosure earlier submitted Japanese Patent Laid-Open No. 2009-149902 explaining that the write operation is carried out by applying a write voltage having a magnitude equal to 1.35 times that of the inverting voltage $V_{c0}$. On the basis of this explanation, in Table 1, the write voltage Vc has a magnitude equal to 1.35 times that of the inverting voltage $V_{c0}$.

As shown in the table, the write voltages Vc are 724 mV for the main memory, 466 mV for the first cache memory and 393 mV for the second cache memory.

In addition, by referring to the relation shown in FIG. 6, for these write voltages Vc, the executable write operation counts each representing the number of executable write operations are found to be $3.3 \times 10^7$ for the main memory, $1.3 \times 10^{17}$ for the first cache memory and $6.5 \times 10^{20}$ for the second cache memory.

As is obvious from the above description, virtually, an infinite number of write operations can be carried out on a cache memory.

The number of executable write operations has a value at the level of $10^7$ times. The number of executable write operations seems small. Considering the fact that the operating period of the storage device is ten years, however, it is possible to state what is written as follows.

If a write operation is carried out at a cycle of 10 ns continuously for a period of 10 years, as described earlier, the number of write operations is $3.2 \times 10^{16}$. In this case, if 64 Mbits are written through 16 I/Os and the number of write operations per bit is further smoothed by adoption of the wear leveling technique, the number of write operations per bit for ten years is $7.5 \times 10^9$.

Considering the fact that information is written onto the main memory only in an operation to transfer the information from the cache memory to the main memory, it is not necessary to increase the number of write operations that can be carried out on the main memory.

As described above, the ST-MRAM is configured to include a main memory and a cache memory. In addition, the thermal stability of the cache memory is reduced and an ECC is introduced to the cache memory. In this way, it is possible to implement a memory to serve as the storage apparatus allowing the write operation to be carried out on the memory virtually an infinite number of times.

7: Method for Changing the Thermal Stability Indicator Δ

Next, the following description explains a method for changing the thermal stability indicator Δ of the storage layer of every storage device in the storage apparatus according to an embodiment of the present disclosure.

In the in-plane magnetization configuration, mainly, the saturated magnetization determines the thermal stability indicator Δ. Thus, in order to obtain the required thermal stability indicator Δ, a method for adjusting the saturated magnetization needs to be devised.

Let CoFeB commonly used as a material for making a storage layer be taken as an example. In this case, by changing the composition of the storage layer, the saturated magnetization can be adjusted.

As a typical composition, the storage layer is doped with a nonmagnetic element. In such a typical composition, the saturated magnetization can be adjusted by changing the quantity of the nonmagnetic element with which the storage layer is doped.

As an example, Table 2 shows results of measurements carried out by a VSM (Vibrating Sample Magnetometer).

TABLE 2

| $(Co_{60}Fe_{40})B_{20}$ [nm] | Ta [nm] | MgO [nm] | Ms [emu/cc] |
|---|---|---|---|
| 2 | — | — | 1172 |
| 3 | 0.4 | — | 736 |
| 3.4 | 0.6 | 0.6 | 611 |
| 4 | 0.9 | 0.8 | 324 |

In the case of a CoFeB simple layer, the saturated magnetization is 1,172 emu/cc. If CoFeB is doped with Ta or MgO, the saturated magnetization is changed to a value in the range 324 to 736 emu/cc. By adjusting the amount of doping, the saturated magnetization can be further changed finely. A nonmagnetic-element doping process was carried out by adoption of a method in which the CoFeB layer was divided into a plurality of sub-layers and a layer of the nonmagnetic element is inserted into the space between each two adjacent CoFeB sub-layers. Each of values of layers described in Table 2 represents the total film thickness of the stacked layers.

It is to be noted that the magnetic material used as the mother body does not have to be CoFeB. For example, CoFe, NiFe or the like can also be used as the magnetic material. By the same token, the nonmagnetic material does not have to be Ta or MgO. For example, Ru, Zr, Mg or the like can also be used as the nonmagnetic material.

Instead of changing the saturated magnetization, the film thickness of the stacked layer can also be changed in order to change the thermal stability indicator Δ. This is because, by changing the film thickness, the volume of the storage layer can be changed.

It is possible to change the shape of the storage layer in accordance with Eq. (3a) in order to change the thermal stability indicator Δ. However, the shape of the storage layer affects the inverting current $I_{c0}$ as indicated by Eq. (6a).

The following description explains typical concrete calculations for changing the shape of the storage layer in order to change the thermal stability indicator Δ. The technique described as follows is devised. The magnetic layer parameters shown in Table 1 as parameters for the main memory are used to change only the shape of the magnetic layer in order to obtain the thermal stability indicator Δ of 45 for the first cache memory. Under the condition of sustaining a fixed area in order to hold the resistance of the storage device at fixed value, the dimensions of 70 nm×210 nm are changed to dimensions of 85 nm×173 nm. At that time, however, the inverting current $I_{c0}$ is 501 μA which are still greater than 332 μA for the first cache memory.

Thus, it is not desirable to adopt a method for reducing the thermal stability indicator Δ by changing the shape of the storage layer.

In the case of the perpendicular magnetization configuration, the thermal stability indicator Δ is determined by both the magnetic isotropy constant and the saturated magnetization. In the same way as the in-plane magnetization configuration, it is possible to change the type of the magnetic material used for making the storage layer as well as the composition of the magnetic material and to adjust the doping amount of the nonmagnetic element and other quantities to desired values in order to obtain a desired thermal stability indicator Δ.

8: Method for Creating Cell Blocks Having Different Thermal Stability Indicators Δ

Next, the following description explains methods each adopted for creating a plurality of cell blocks having different thermal stability indicators Δ of the storage layers of the storage devices in the cell blocks of the storage apparatus according to an embodiment of the present disclosure. The following three concrete methods are described.

First Method

First of all, the first method is explained as follows.

FIGS. 8A to 8I are diagrams showing the flow of a manufacturing process adopting the first method.

Figure 8A:
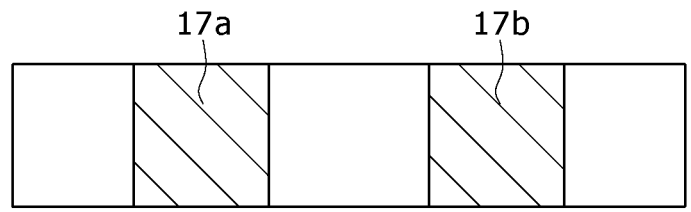
FIGS. 8A to 8I are diagrams each to be referred to in description of a first method for creating cell blocks having different thermal stabilities.

FIG. 8A shows a connection plug 17a provided for the cell block 5a and a connection plug 17b provided for the cell block 5b.

Figure 8B:
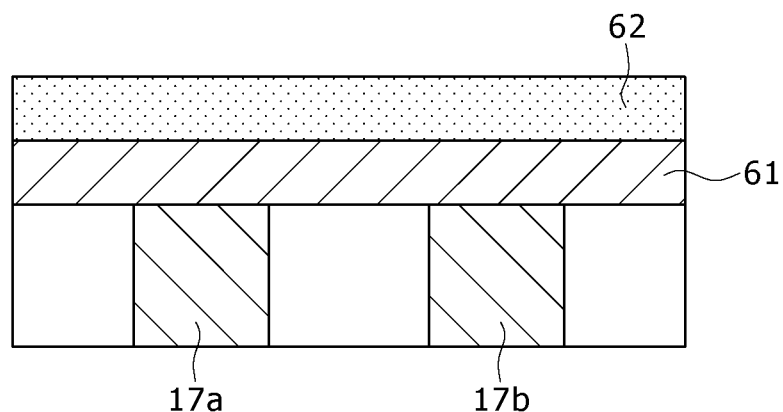

As shown in FIG. 8B, a magnetic multi-layer film 61 serving as the origin of the storage device is created on the connection plugs 17a and 17b by adoption of a film creation method such as the sputtering method, being connected to the connection plugs 17a and 17b.

Then, as shown in FIG. 8B, the upper surface of the magnetic multi-layer film 61 is coated with a photo-resist film 62 by adoption of typically a spin coating method.

Figure 8C:
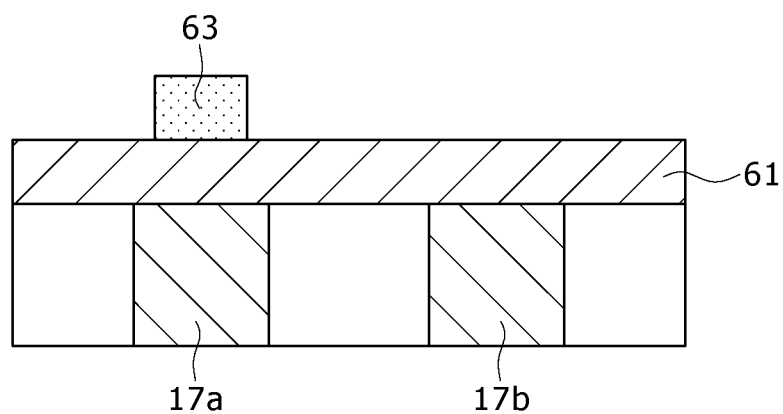

Subsequently, as shown in FIG. 8C, the photo-resist film 62 is subjected to a patterning process by adoption of a lithography technique in order to create a resist mask 63 over the connection plug 17a.

Figure 8D:
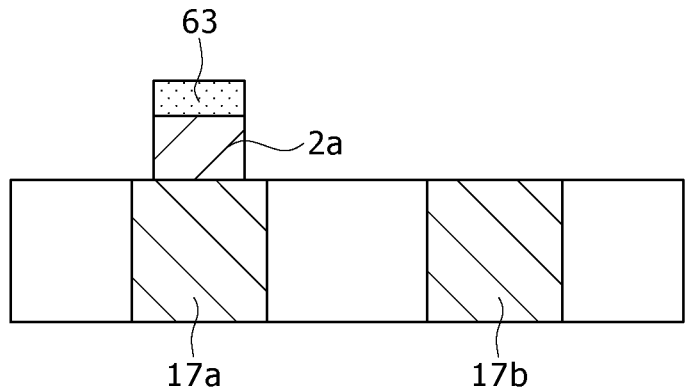

Then, as shown in FIG. 8D, the magnetic multi-layer film 61 is subjected to an etching process by adoption of a technique such as the ion milling technique or the RIE (Reactive Ion Etching) technique. In this process, the storage device 2a under the resist mask 63 is not etched due to the protection by the resist mask 63.

Subsequently, the resist mask 63 is peeled off by organic solvent or the like.

Figure 8E:
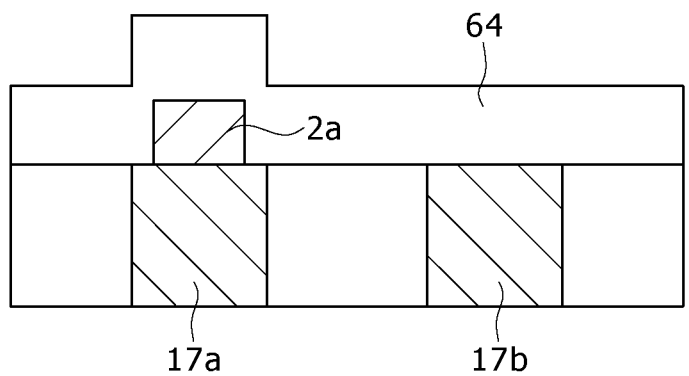

Then, as shown in FIG. 8E, an inter-layer insulation film 64 is created to cover all.

Figure 8F:
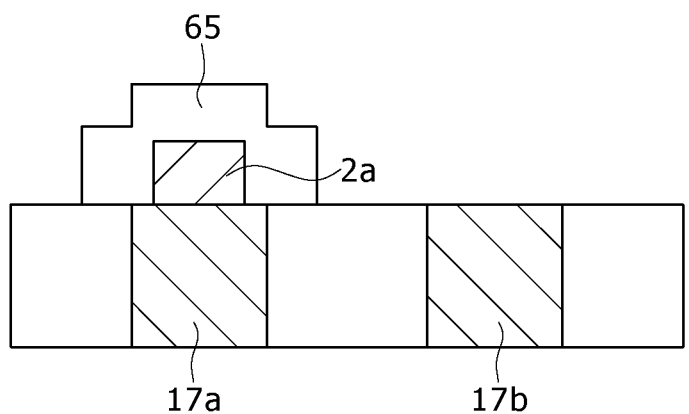

Subsequently, as shown in FIG. 8F, the inter-layer insulation film 64 is subjected to an etching process in order to create an insulation mask 65 covering the storage device 2a.

Figure 8G:
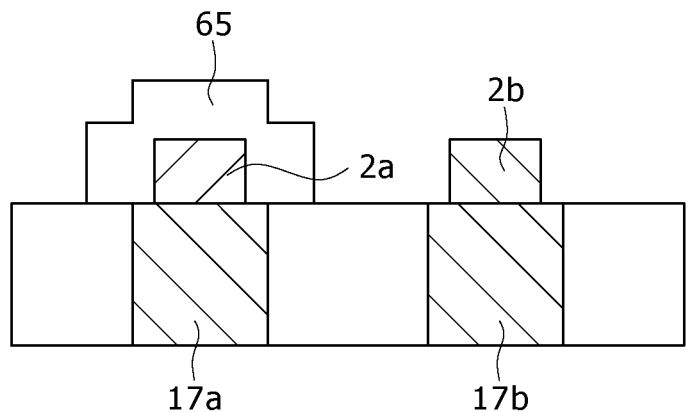

Then, a storage device 2b on the connection plug 17b is created by adoption of the same method as the creation of the storage device 2a. To be more specific, the storage device 2b is created by sequentially carrying out the process to create a magnetic multi-layer film serving as the origin of the storage device 2b including a storage layer having a configuration different from the storage layer of the storage device 2a originated from the magnetic multi-layer film 61, the resist patterning process, the etching process and the resist peeling process. As a result, the storage device 2b is created on the connection plug 17b, being connected to the connection plug 17b as shown in FIG. 8G.

Figure 8H:
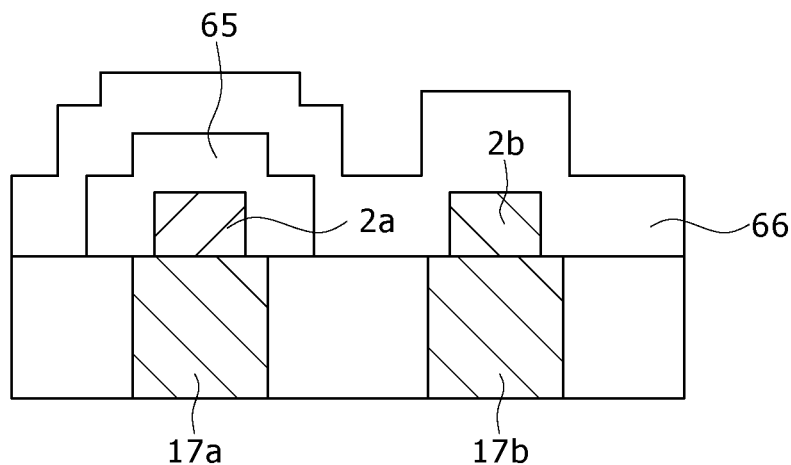

Then, as shown in FIG. 8H, an inter-layer insulation film 66 is created to cover all.

Figure 8I:
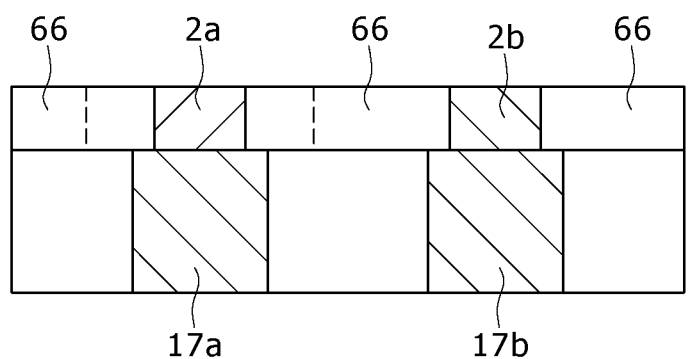

Subsequently, as shown in FIG. 8I, the surface is polished to make the surface flat by adoption of a polishing technique such as the CMP (Chemical Mechanical Polishing) technique.

By making the configuration of the storage layer of the created storage device 2b different from the configuration of the storage layer of the created storage device 2a as described above, the thermal stability indicator Δ of the storage device 2b can be made different from the thermal stability indicator n of the storage device 2a.

Second Method

Next, the second method is explained as follows.

FIGS. 9A to 9F are diagrams showing the flow of a manufacturing process adopting the second method.

First of all, the same processes as those shown in FIGS. 8A and 8B for the first method are carried out.

Figure 9A:
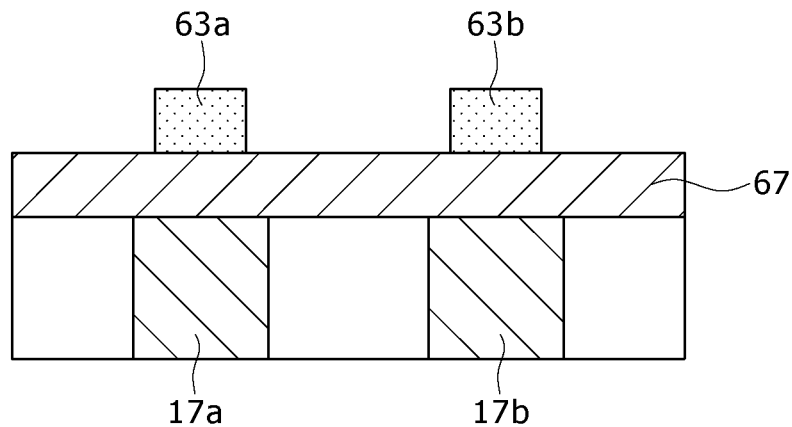
FIGS. 9A to 9F are diagrams each to be referred to in description of a second method for creating cell blocks having different thermal stabilities.

Then, the photo-resist film 62 is subjected to a patterning process by adoption of a lithography technique. Thus, the resist masks 63a and 63b are created on the connection plugs 17a and 17B respectively as shown in FIG. 9A. It is to be noted that the magnetic multi-layer film 67 shown in FIG. 9A is the same as the magnetic multi-layer film 61 shown in FIG. 8B.

Figure 9B:
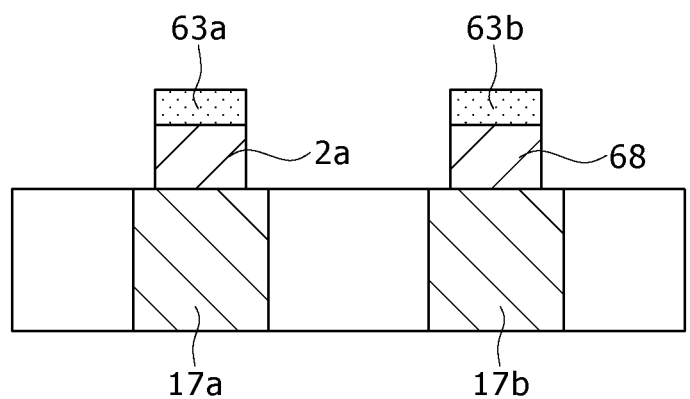

Subsequently, the magnetic multi-layer film 67 is subjected to an etching process by adoption of a technique such as the ion milling technique or the RIE technique. In this process, as shown in FIG. 9B, the storage device 2a of the magnetic multi-layer film 67 under the resist mask 63a is not etched due to the protection by the resist mask 63a whereas a magnetic multi-layer film portion 68 of the magnetic multi-layer film 67 under the resist mask 63b is not etched due to the protection by the resist mask 63b.

Figure 9C:
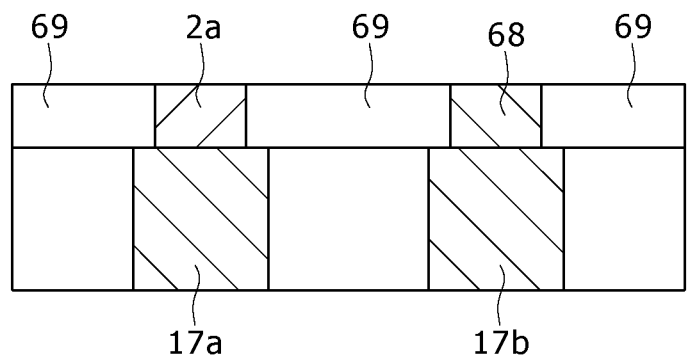

Subsequently, the resist mask 63a and the resist mask 63b are peeled off by organic solvent or the like. Then, an inter-layer insulation film 69 is created to cover all. Subsequently, as shown in FIG. 9C, the surface is polished to make the surface flat by adoption of a polishing technique such as the CMP technique.

Figure 9D:
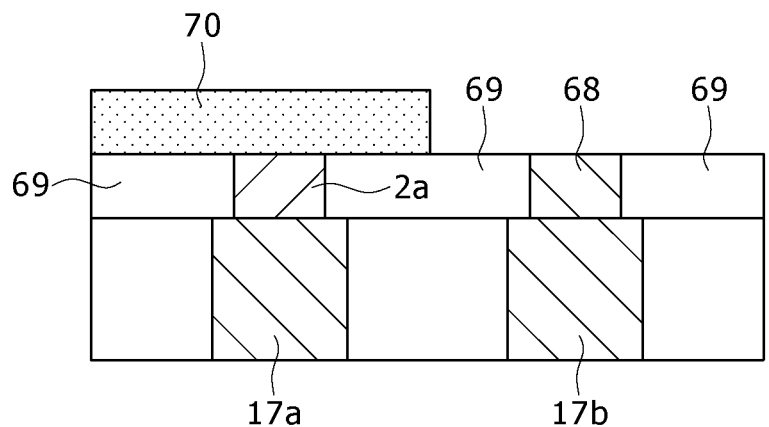

Then, after a photo-resist film has been applied by adoption of a spin coating technique, the photo-resist film is subjected to a patterning process by a lithography technique in order to create a resist mask 70 as shown in FIG. 9D. The resist mask 70 is created by leaving the surroundings of the magnetic multi-layer film portion 68 in a state of being exposed. In this process, the resist mask 70 is created to completely cover the storage device 2a.

Figure 9E:
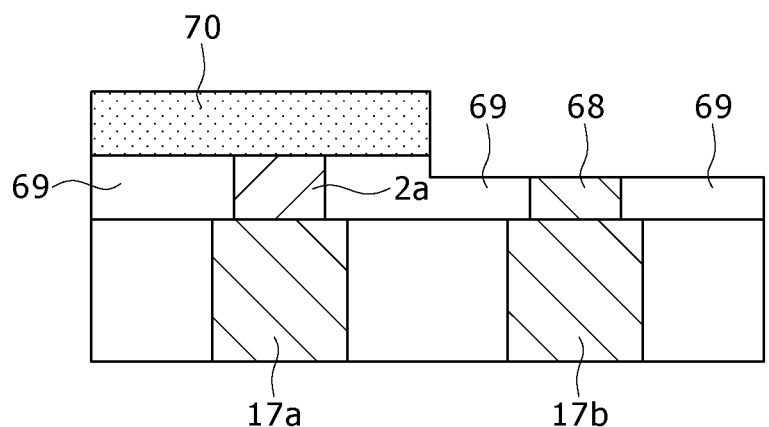

Subsequently, as shown in FIG. 9E, areas not covered by the resist mask 70 are subjected to an etching process by adoption of a technique such as the ion milling technique or the RIE technique. In this process, the etching depth is adjusted so as to etch a portion of the storage layer and all the top coat layer composing the magnetic multi-layer film portion 68. A portion left in the magnetic multi-layer film portion 68 after the etching process becomes the storage device 2b shown in FIG. 9F. Thus, the depth of the storage device 2b is shallower than the depth of the storage device 2a.

Figure 9F:
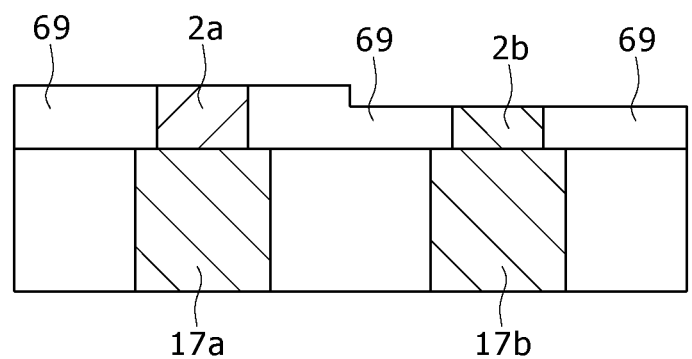

Finally, as shown in FIG. 9F, the resist mask 70 is peeled off by organic solvent or the like.

By carrying out the processes described above, the thickness of the storage layer of the storage device 2b is made different from the thickness of the storage layer of the storage device 2a so that the saturated magnetizations of the storage layers are also different from each other. Thus, it is possible to create the storage device 2a and the storage device 2b having a thermal stability indicator Δ different from the thermal stability indicator Δ of the storage device 2a.

Third Method

Next, the third method is explained as follows.

Figure 10A:
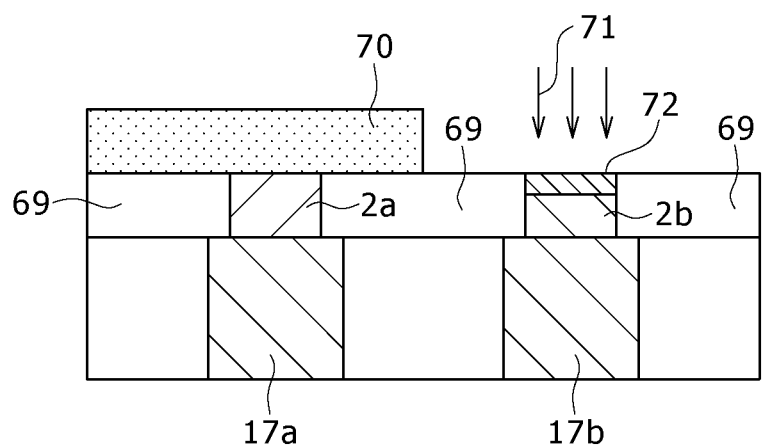
FIGS. 10A and 10B are diagrams each to be referred to in description of a third method for creating cell blocks having different thermal stabilities.
Figure 10B:
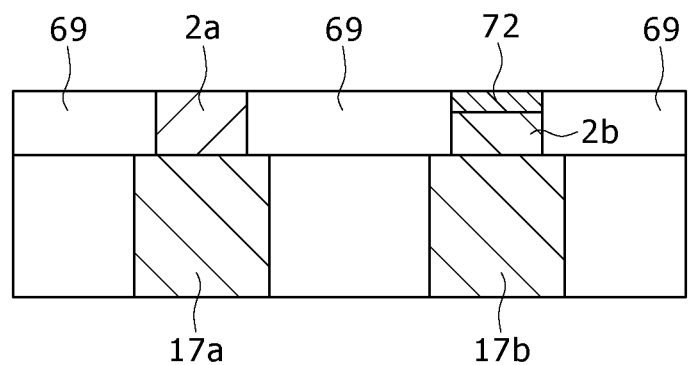

FIGS. 10A and 10B are diagrams showing the flow of a manufacturing process adopting the third method.

First of all, the same processes as the processes explained above by referring to FIGS. 9A to 9D for the second method are carried out.

Then, as shown in FIG. 10A, plasmas 71 such as oxygen plasmas are radiated to the magnetic multi-layer film portion 68 in order to change a portion of the magnetic multi-layer film portion 68 which is not covered by the resist mask 70 to an altered layer 72.

At that time, since oxygen is absorbed by a part of the magnetic multi-layer film portion 68, the saturated magnetization of the storage layer is reduced or the effective film thickness of the storage layer is decreased. The strength of the radiated plasmas 71 and their radiation duration are adjusted so that the altered layer 72 attains a portion of the storage layer and all the top coat layer composing the magnetic multi-layer film portion 68.

Finally, as shown in FIG. 10B, the resist mask 70 is peeled off by organic solvent or the like.

The existence of the altered layer 72 created as described above changes the saturated magnetization of the storage device 2b. Thus, it is possible to create the storage devices 2a and 2b having thermal stability indicators Δ different from each other.

By adopting any one of the three methods described above, it is possible to create the storage devices 2a and 2b with storage layers having thermal stability indicators Δ different from each other.

Implementations of the present disclosure are by no means limited to the embodiments described above. That is to say, it is possible to provide a variety of other configurations as long as the other configurations fall within the spirit and scope of the present disclosure.

The present application contains subject matter related to that disclosed in Japanese Priority Patent Application JP 2010-150178 filed in the Japan Patent Office on Jun. 30, 2010, the entire content of which is hereby incorporated by reference.

What is claimed is:

1. A storage apparatus comprising:
a cell array including a plurality of storage devices arranged to form an array, each of the storage devices including
a storage layer for storing information as a state of magnetization of a magnetic substance;
a fixed-magnetization layer having a fixed magnetization direction; and
a tunnel insulation layer between the storage layer and the fixed-magnetization layer, the storage device being configured such that, in order to write information on the storage layer, a write current is generated to flow in a layer-stacking direction of the storage layer and the fixed-magnetization layer to change a direction of magnetization of the storage layer,
wherein,
the cell array is divided into a plurality of cell blocks including a first cell block and a second cell block, and
a thermal stability of the storage layer of any particular one of the storage devices has a value peculiar to a corresponding cell block that includes the particular storage device, a storage layer of a storage device included in the first cell block having a first thermal-stability value peculiar to the first cell block and a storage layer of a storage device included in the second cell block having a second thermal-stability value peculiar to the second cell block, the first thermal-stability value peculiar to the first cell block being different from the second thermal-stability value peculiar to the second cell block.

2. The storage apparatus according to claim 1, wherein the thermal stability of the storage layer of any particular one of the storage devices is set at the value peculiar to the corresponding cell block that includes the particular storage device by adjusting saturated magnetization of the storage layer of the particular storage device to a level peculiar to the corresponding cell block that includes the particular storage device.

3. The storage apparatus according to claim 1, wherein the thermal stability of the storage layer of any particular one of the storage devices is set at the value peculiar to the corresponding cell block that includes the particular storage device by adjusting a magnetic anisotropy constant of the storage layer of the particular storage device to a value peculiar to the corresponding cell block that includes the particular storage device.

4. The storage apparatus according to claim 1, wherein at least one of the cell blocks is provided with an error correction function.

5. The storage apparatus according to claim 1, wherein the storage apparatus is configured to transfer a portion or all of information stored in any particular one of the cell blocks to another one of the cell blocks.

6. The storage apparatus according to claim 1, wherein the first cell block is a main memory block and the second cell block is a cache memory block.

7. The storage apparatus according to claim 6, wherein the first thermal-stability value peculiar to the first cell block is higher than the second thermal-stability value peculiar to the second cell block.

* * * * *